(12) United States Patent
Yang et al.

(10) Patent No.: US 8,593,326 B2
(45) Date of Patent: Nov. 26, 2013

(54) DUAL-MODE COMPARATOR AND ANALOG TO DIGITAL CONVERTER HAVING THE SAME

(75) Inventors: Han Yang, Seoul (KR); Kwang-Hyun Lee, Seongnam-si (KR); Yong Lim, Hwaseong-si (KR); Yu-Jin Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/540,833

(22) Filed: Jul. 3, 2012

(65) Prior Publication Data

US 2013/0009800 A1 Jan. 10, 2013

(30) Foreign Application Priority Data

Jul. 8, 2011 (KR) .................. 10-2011-0067647

(51) Int. Cl.
*H03M 1/56* (2006.01)
(52) U.S. Cl.
USPC .......................................... 341/169; 341/155
(58) Field of Classification Search
USPC ................. 341/169, 155, 156, 159, 118, 164; 327/63
See application file for complete search history.

(56) References Cited

U.S. PATENT DOCUMENTS

| | | | |
|---|---|---|---|
| 7,292,177 B2 * | 11/2007 | Muramatsu et al. | .......... 341/164 |
| 7,683,307 B2 | 3/2010 | Kawaguchi et al. | |
| 2010/0002120 A1 | 1/2010 | Yoshikawa et al. | |
| 2010/0091167 A1 | 4/2010 | Azami | |

FOREIGN PATENT DOCUMENTS

| | | |
|---|---|---|
| JP | 2009-171397 A | 7/2009 |
| JP | 2010-016656 A | 1/2010 |
| JP | 2010093641 A | 4/2010 |

* cited by examiner

*Primary Examiner* — Joseph Lauture
(74) *Attorney, Agent, or Firm* — Harness, Dickey & Pierce

(57) ABSTRACT

A dual-mode comparator may include an object voltage input unit that generates a first current flowing through a first path and a second current flowing through a second path based on a first object voltage and a second object voltage, a current mirror unit that performs a current-mirror operation for the first path and the second path to output a comparison voltage at an output terminal, a bias unit that generates a bias current corresponding to a sum of the first current and the second current, and a mode switching unit that controls the current mirror unit to have a first structure in an auto-zero mode and that controls the current mirror unit to have a second structure in a comparison mode.

20 Claims, 17 Drawing Sheets

DUAL-MODE COMPARATOR AND ANALOG TO DIGITAL CONVERTER HAVING THE SAME

CROSS-REFERENCE TO RELATED APPLICATION(S)

This application claims priority under 35 USC §119 to Korean Patent Applications No. 10-2011-0067647, filed on Jul. 8, 2011 in the Korean Intellectual Property Office (KIPO), the contents of which are incorporated herein in its entirety by reference.

BACKGROUND

1. Technical Field

Example embodiments relate to a comparator and/or an analog to digital converter having the same.

2. Description of the Related Art

Recently, a Charge Coupled Device (CCD) image sensor and a Complementary Metal Oxide Semiconductor (CMOS) image sensor are widely used as an image sensor. Typically, an image sensor includes an analog to digital converter that converts an analog signal (i.e., a pixel output voltage) output from a unit pixel into a digital signal. For example, the analog to digital converter may convert the analog signal to the digital signal by comparing the pixel output voltage with a ramp voltage, and by counting a clock signal until the ramp voltage is the same as the pixel output voltage. Therefore, the analog to digital converter includes a comparator for comparing the pixel output voltage with the ramp voltage. In case of a conventional comparator, however, a current consumed before a decision point of the conventional comparator is different from a current consumed after the decision point of the conventional comparator. As a result, a power voltage fluctuation may be caused by the conventional comparator in the analog to digital converter.

SUMMARY

Some example embodiments provide a dual-mode comparator capable of equalizing a current consumed before a decision point of the dual-mode comparator with a current consumed after the decision point of the dual-mode comparator by changing a structure of the dual-mode comparator according to operation modes (i.e., an auto-zero mode and a comparison mode).

Some example embodiments provide an analog to digital converter having the dual-mode comparator.

According to some example embodiments, a dual-mode comparator may include an object voltage input unit that generates a first current flowing through a first path and a second current flowing through a second path based on a first object voltage and a second object voltage, a current mirror unit that performs a current-mirror operation for the first path and the second path to output a comparison voltage at an output terminal, a bias unit that generates a bias current corresponding to a sum of the first current and the second current, and a mode switching unit that controls the current mirror unit to have a first structure in an auto-zero mode and that controls the current mirror unit to have a second structure in a comparison mode.

In example embodiments, the object voltage input unit may include a first transistor that allows the first current to flow through the first path based on the first object voltage, and a second transistor that allows the second current to flow through the second path based on the second object voltage.

In example embodiments, the current mirror unit may include a third transistor coupled between a first supply voltage and the first transistor, the third transistor located on the first path, and a fourth transistor coupled between the first supply voltage and the second transistor, the fourth transistor located on the second path.

In example embodiments, the bias unit may include a fifth transistor coupled between the first and second transistors and a second supply voltage.

In example embodiments, the mode switching unit may include a first switch that turns-on in the auto-zero mode to couple gate electrodes of the third and fourth transistors to a drain electrode of the third transistor and that turns-off in the comparison mode, and a second switch that turns-on in the comparison mode to couple the gate electrodes of the third and fourth transistors to a drain electrode of the fourth transistor and that turns-off in the auto-zero mode.

In example embodiments, the mode switching unit may further include a third switch that turns-on in the auto-zero mode to couple a gate electrode of the second transistor to a drain electrode of the second transistor and that turns-off in the comparison mode.

In example embodiments, the mode switching unit may further include a fourth switch that turns-on in the auto-zero mode to couple a gate electrode of the first transistor to a drain electrode of the first transistor and that turns-off in the comparison mode.

In example embodiments, the first structure may be a structure in which the gate electrodes of the third and fourth transistors are coupled to the drain electrode of the third transistor, and the second structure may be a structure in which the gate electrodes of the third and fourth transistors are coupled to the drain electrode of the fourth transistor.

In example embodiments, the first and second transistors may be N-type metal oxide semiconductor (NMOS) transistors, the third and fourth transistors may be P-type metal oxide semiconductor (PMOS) transistors, and the fifth transistor may be a NMOS transistor.

In example embodiments, the first supply voltage may correspond to a power source voltage, and the second supply voltage may correspond to a ground voltage.

In example embodiments, the first and second transistors may be PMOS transistors, the third and fourth transistors may be NMOS transistors, and the fifth transistor may be a PMOS transistor.

In example embodiments, the first supply voltage may correspond to a ground voltage, and the second supply voltage may correspond to a power source voltage.

According to some example embodiments, an analog to digital converter may include a ramp voltage generator that generates a ramp voltage, a dual-mode comparator that performs an offset eliminating operation in an auto-zero mode, and that generates a comparison result signal by comparing the ramp voltage with a pixel output voltage in a comparison mode, a structure of the dual-mode comparator being changed according to the auto-zero mode and the comparison mode, and a digital signal generator that generates a digital signal corresponding to the pixel output voltage based on the comparison result signal by a clock signal counting method.

In example embodiments, the dual-mode comparator may include a first comparator that compares the ramp voltage with the pixel output voltage to generate a first comparison voltage, and a second comparator that compares the first comparison voltage with a reference voltage to generate a second comparison voltage.

In example embodiments, the second comparator may include an object voltage input unit that generates a first current flowing through a first path and a second current flowing through a second path based on the first comparison voltage and the reference voltage, a current mirror unit that performs a current-mirror operation for the first path and the second path to output the second comparison voltage at an output terminal, a bias unit that generates a bias current corresponding to a sum of the first current and the second current, and a mode switching unit that controls the current mirror unit to have a first structure in the auto-zero mode and that controls the current mirror unit to have a second structure in the comparison mode.

Therefore, a dual-mode comparator according to example embodiments may equalize a current consumed before a decision point of the dual-mode comparator with a current consumed after the decision point of the dual-mode comparator by changing a structure of the dual-mode comparator according to operation modes (i.e., an auto-zero mode and a comparison mode).

In addition, an analog to digital converter according to example embodiments may prevent a power voltage fluctuation based on operations of the dual-mode comparator that equalizes a current consumed before the decision point of the dual-mode comparator with a current consumed after the decision point of the dual-mode comparator.

Another example embodiment provides a dual-mode comparator configured to compare a first object voltage with a second object voltage including an object voltage input circuit configured to generate a same bias current before and after transition of at least the first object voltage from a first logic level to a second logic level.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
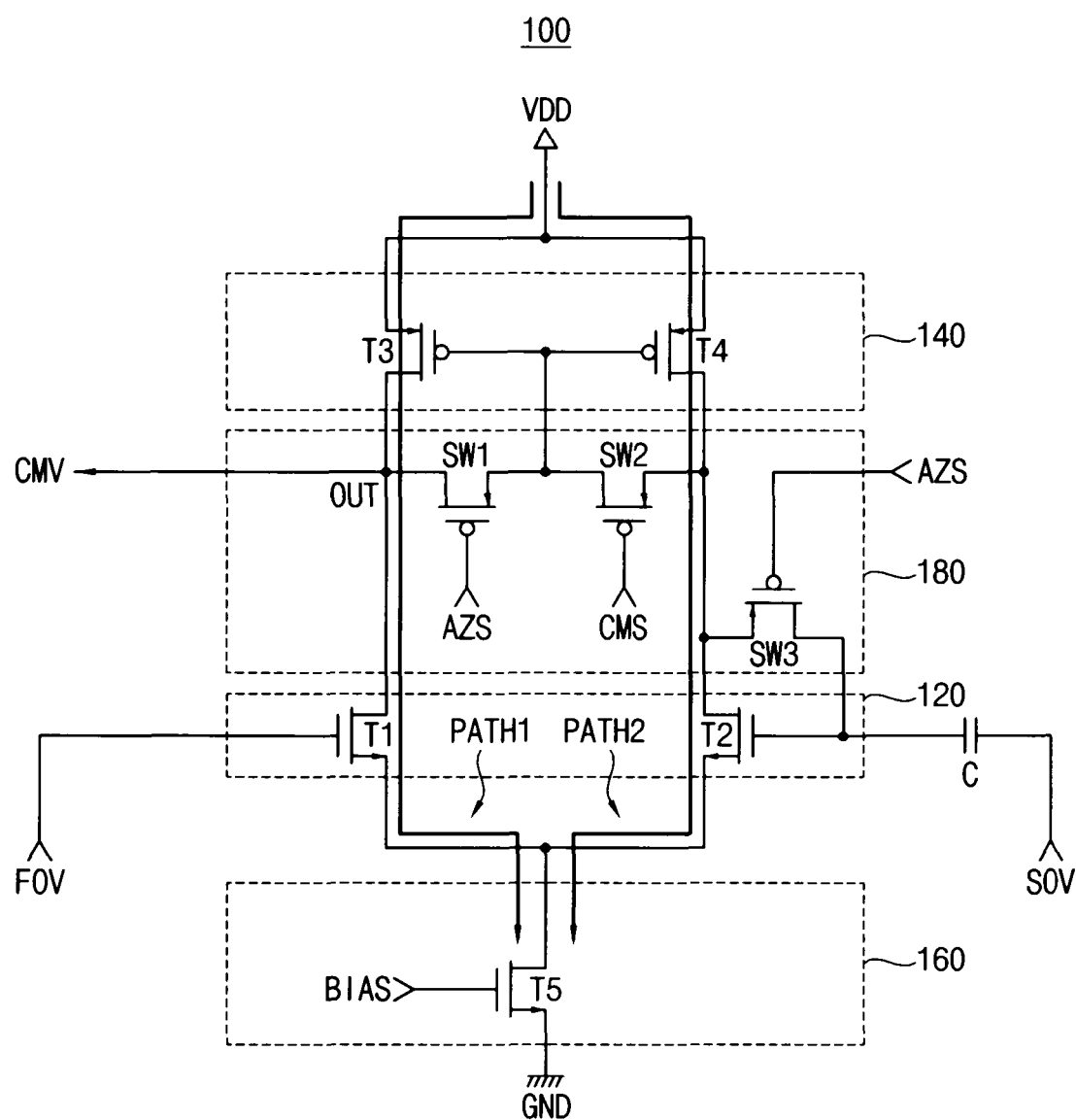
FIG. 1 is a circuit diagram illustrating a dual-mode comparator according to an example embodiment.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a dual-mode comparator according to an example embodiment.

Referring to FIG. 1, the dual-mode comparator 100 may include a output voltage input unit 120, a current mirror unit 140, a bias unit 160, and a mode switching unit 180.

The output voltage input unit 120 may generate a first current flowing through a first path PATH1 and a second current flowing through a second path PATH2 based on a first object voltage FOV and a second object voltage SOV.

The first path PATH1 indicates a route on which a first transistor T1 and a third transistor T3 are placed, the first transistor T1 and the third transistor T3 being coupled between a first supply voltage VDD and a second supply voltage GND. The second path PATH2 indicates a route on which a second transistor T2 and a fourth transistor T4 are placed, the second transistor T2 and the fourth transistor T4 being coupled between the first supply voltage VDD and the second supply voltage GND. Here, the first supply voltage VDD may correspond to a power source voltage, and the second supply voltage GND may correspond to a ground voltage. In one example embodiment, the output voltage input unit 120 may include the first transistor T1 that allows the first current to flow through the first path PATH1 based on the first object voltage FOV, and the second transistor T2 that allows the second current to flow through the second path PATH2 based on the second object voltage SOV.

As illustrated in FIG. 1, a gate electrode of the first transistor T1 may be coupled to the first object voltage FOV, a source electrode of the first transistor T1 may be coupled to a drain electrode of the fifth transistor T5, and a drain electrode of the first transistor T1 may be coupled to a drain electrode of the third transistor T3. In addition, a gate electrode of the second transistor T2 may be coupled to the second object voltage SOV, a source electrode of the second transistor T2 may be coupled to the drain electrode of the fifth transistor T5, and a drain electrode of the second transistor T2 may be coupled to a drain electrode of the fourth transistor T4. The first and second transistors T1 and T2 may be N-type Metal Oxide Semiconductor (NMOS) transistors. However, the first and second transistors T1 and T2 are not limited thereto.

Figure 6:
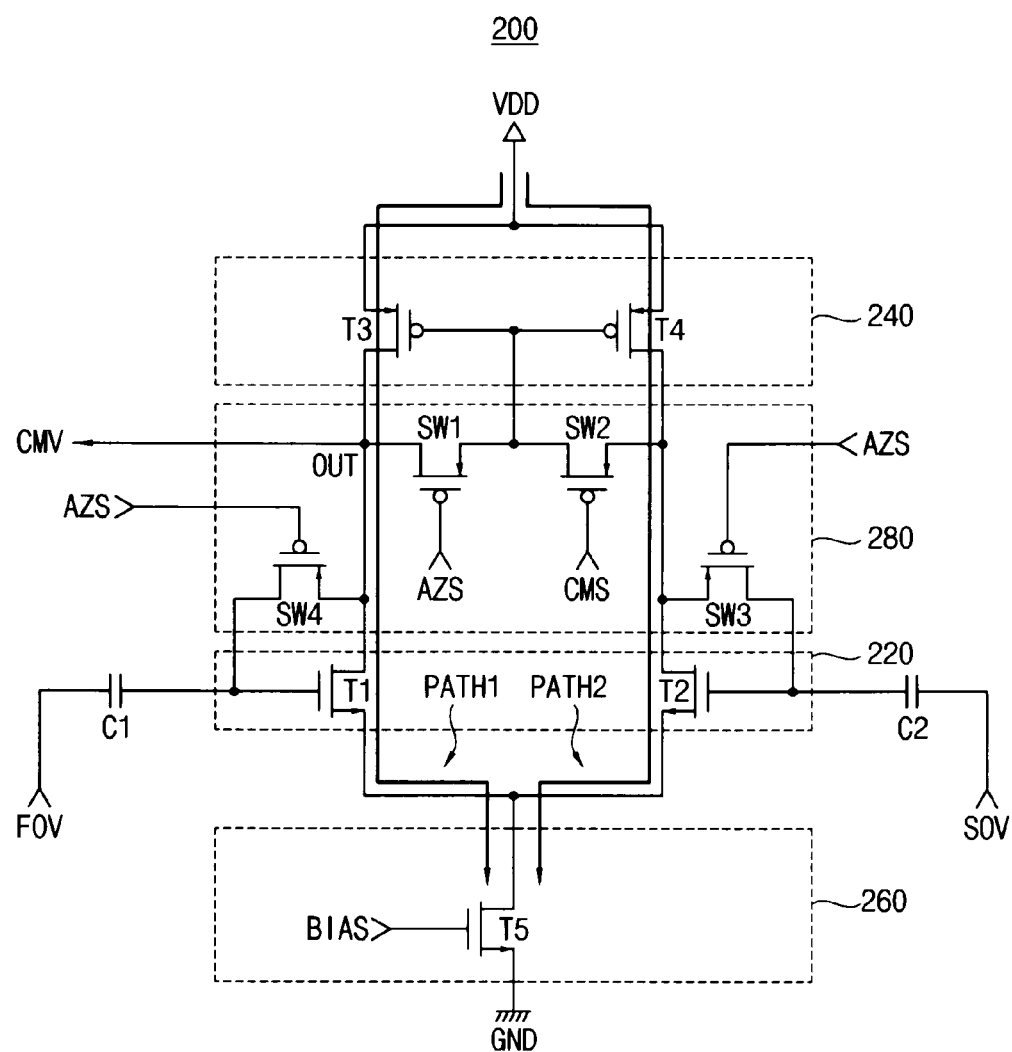
FIG. 6 is a circuit diagram illustrating a dual-mode comparator according to an example embodiment.

A capacitor C may be coupled to the gate electrode of the second transistor T2. The capacitor C may eliminate Direct-Current (DC) components when the second object voltage SOV is applied to the second transistor T2. According to some example embodiments, another capacitor may also be coupled to the gate electrode of the first transistor T1 to eliminate DC components when the first object voltage FOV is applied to the first transistor T1, as shown in FIG. 6.

The current mirror unit 140 may perform a current-mirror operation for the first path PATH1 and the second path PATH2, and may output a comparison voltage CMV at an output terminal OUT.

As illustrated in FIG. 1, the current mirror unit 140 may include the third transistor T3 and the fourth transistor T4 of which the gate electrodes are coupled to each other. In addition, the source electrode of the third transistor T3 may be coupled to the first supply voltage VDD, and the drain electrode of the third transistor T3 may be coupled to the drain electrode of the first transistor T1. Further, the source electrode of the fourth transistor T4 may be coupled to the first supply voltage VDD, and the drain electrode of the fourth transistor T4 may be coupled to the drain electrode of the second transistor T2.

The third and fourth transistors T3 and T4 may be P-type Metal Oxide Semiconductor (PMOS) transistors. However, the third and fourth transistors T3 and T4 are not limited thereto.

Further, the output terminal OUT may correspond to the drain electrode of the third transistor T3 and the drain electrode of the first transistor T1. The output terminal OUT may output the comparison voltage CMV corresponding to a voltage generated by amplifying a difference between the first object voltage FOV and the second object voltage SOV.

In an auto-zero mode, the gate electrode of the third transistor T3 and the gate electrode of the fourth transistor T4 may be coupled to the drain electrode of the third transistor T3. In a comparison mode, the gate electrode of the third transistor T3 and the gate electrode of the fourth transistor T4 may be coupled to the drain electrode of the fourth transistor T4. As a result, the current mirror unit 140 may have a structure capable of performing the current-mirror operation for the first path PATH1 and the second path PATH2.

The bias unit 160 may generate a bias current corresponding to a sum of the first current flowing through the first path PATH1 and the second current flowing through the second path PATH2. In one example embodiment, the bias unit 160 may include the fifth transistor T5 that receives a bias voltage BIAS to generate the bias current. As illustrated in FIG. 1, the gate electrode of the fifth transistor T5 may be coupled to the bias voltage BIAS, the source electrode of the fifth transistor T5 may be coupled to the second supply voltage GND, and the drain electrode of the fifth transistor T5 may be coupled to the source electrode of the first transistor T1 and the source electrode of the second transistor T2. Here, the fifth transistor T5 may be a NMOS transistor. However, the fifth transistor T5 is not limited thereto. Thus, the bias unit 160 may act as a current source for the dual-mode comparator 100.

The mode switching unit 180 may control the current mirror unit 140 to have a first structure in the auto-zero mode, and may control the current mirror unit 140 to have a second structure in the comparison mode.

The first structure is a structure in which the gate electrode of the third transistor T3 and the gate electrode of the fourth transistor T4 are coupled to the drain electrode of the third transistor T3. The second structure is a structure in which the gate electrode of the third transistor T3 and the gate electrode of the fourth transistor T4 are coupled to the drain electrode of the fourth transistor T4.

In one example embodiment, the mode switching unit 180 may include a first switch SW1 and a second switch SW2. The first switch SW1 may be configured to turn-on in the auto-zero mode to couple the gate electrode of the third transistor T3 and the gate electrode of the fourth transistor T4 to the drain electrode of the third transistor T3 and thus create the first structure. The second switch SW2 may be configured to turn-on in the comparison mode to couple the gate electrode of the third transistor T3 and the gate electrode of the fourth transistor T4 to the drain electrode of the fourth transistor T4 and thus create the second structure. The first switch SW1 turns-off in the comparison mode, and the second switch SW2 turns-off in the auto-zero mode.

The mode switching unit 180 may further include a third switch SW3 that turns-on in the auto-zero mode to couple the gate electrode of the second transistor T2 to the drain electrode of the second transistor T2, and that turns-off in the comparison mode. The third switch SW3 may eliminate an offset of the dual-mode comparator 100 by coupling the drain electrode of the second transistor T2 to the gate electrode of the second transistor T2 when the gate electrode of the third transistor T3 and the gate electrode of the fourth transistor T4 are coupled to the drain electrode of the third transistor T3 in the auto-zero mode.

Although the first through third switches SW1, SW2, and SW3 are illustrated as PMOS transistors in FIG. 1, the first through third switches SW1, SW2, and SW3 are not limited thereto. For example, the first through third switches SW1, SW2, and SW3 may be replaced with any elements capable of performing a switching operation. Meanwhile, if the first through third switches SW1, SW2, and SW3 are PMOS transistors, the first through third switches SW1, SW2, and SW3 may turn-on when an auto-zero signal AZS and a comparison mode signal CMS have a logic low level.

As described above, the mode switching unit 180 may change a structure of the current mirror unit 140 according to the operation mode (i.e., the auto-zero mode and the comparison mode). In the auto-zero mode, the mode switching unit 180 may control the current mirror unit 140 to have the first structure. In the comparison mode, the mode switching unit 180 may control the current mirror unit 140 to have the second structure.

As a result, an offset of the dual-mode comparator 100 may be eliminated because the drain electrode of the second transistor T2 is coupled to the gate electrode of the second transistor T2 when the gate electrode of the third transistor T3 and the gate electrode of the fourth transistor T4 are coupled to the drain electrode of the third transistor T3 in the auto-zero mode. In addition, a comparison operation between the first object voltage FOV and the second object voltage SOV may be properly performed because the gate electrode of the second transistor T2 acts as the positive input terminal INP and the gate electrode of the first transistor T1 acts as the negative input terminal INN when the gate electrode of the third transistor T3 and the gate electrode of the fourth transistor T4 are coupled to the drain electrode of the fourth transistor T4 in the comparison mode.

The dual-mode comparator 100 may equalize a current consumed before a decision point of the dual-mode comparator 100 with a current consumed after the decision point of the dual-mode comparator 100. The decision point being a timing point at which signals applied to the positive input terminal INP and the negative input terminal INN are changed from a logic low level to a logic high level or from a logic high level to a logic low level. Thus, the dual-mode comparator 100 may prevent the power voltage fluctuation for a circuit including the dual-mode comparator 100 by having a structure capable of performing an auto-zero operation in the auto-zero mode, and by having a structure capable of maintaining the bias current before and after the decision point in the comparison mode.

Figure 2:
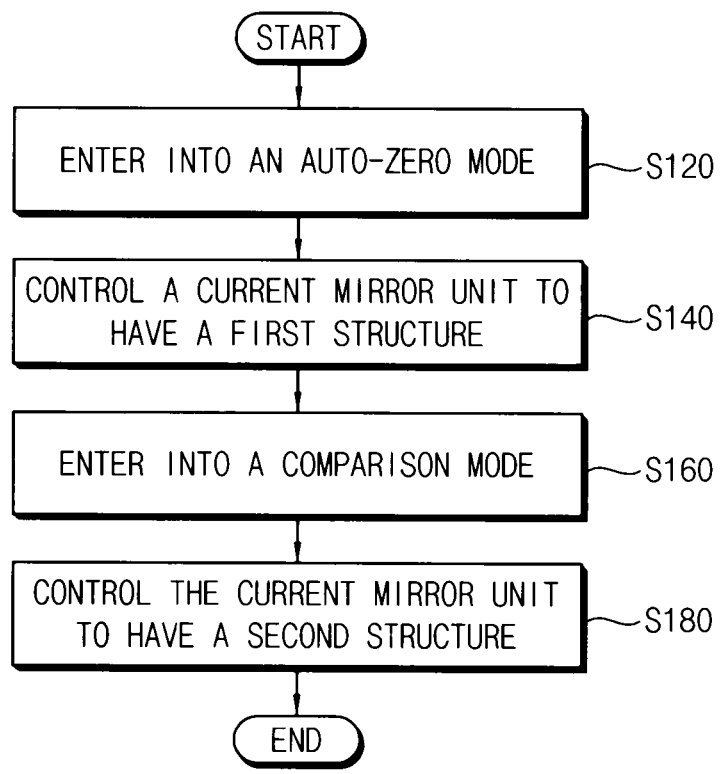
FIG. 2 is a flow chart illustrating operations of a dual-mode comparator of FIG. 1.

FIG. 2 is a flow chart illustrating operations of a dual-mode comparator of FIG. 1.

Referring to FIGS. 1 and 2, when the dual-mode comparator 100 enters into the auto-zero mode (Step S120), the dual-mode comparator 100 controls the current mirror unit 140 to have the first structure (Step S140). In addition, when the dual-mode comparator 100 enters into the comparison mode (Step S160), the dual-mode comparator 100 controls the current mirror unit 140 to have the second structure (Step S180).

As described above, the first structure of the current mirror unit 140 is a structure capable of performing an auto-zero operation in the auto-zero mode, and the second structure of the current mirror unit 140 is a structure capable of maintaining a current (i.e., the bias current) consumed before and after the decision point in the comparison mode. The auto-zero operation may be performed by the dual-mode comparator 100 when the third switch SW3 turns-on in response to the auto-zero signal AZS and the gate electrode of the third transistor T3 and the gate electrode of the fourth transistor T4 are coupled to the drain electrode of the third transistor T3 in response to the auto-zero signal AZS and the comparison mode signal CMS. When the third switch SW3 turns-on, an offset of the dual-mode comparator 100 may be stored in the capacitor C.

The comparison operation may be performed by the dual-mode comparator 100 when the gate electrode of the third transistor T3 and the gate electrode of the fourth transistor T4 are coupled to the drain electrode of the fourth transistor T4. A comparison error due to an offset may be eliminated when the dual-mode comparator 100 compares the first object voltage FOV with the second object voltage SOV. The dual-mode comparator 100 may maintain the bias current before and after the decision point because the gate electrode of the third transistor T3 and the gate electrode of the fourth transistor T4 are coupled to the drain electrode of the fourth transistor T4.

At the decision point of the dual-mode comparator 100, signals that are applied to the positive input terminal INP and the negative input terminal INN are changed from a logic low level to a logic high level or from a logic high level to a logic low level.

Figure 3:
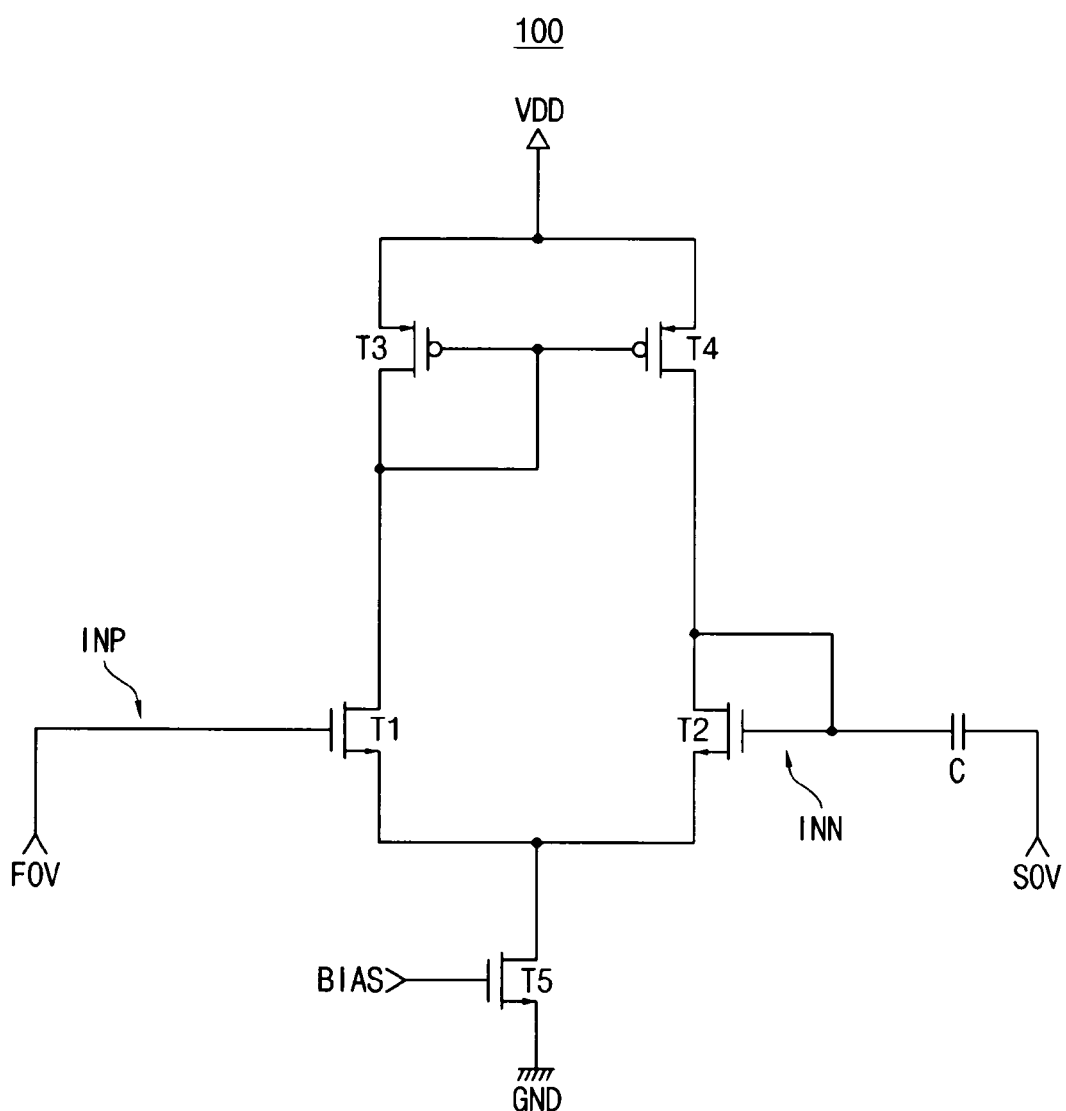
FIG. 3 is a diagram illustrating an example in which a dual-mode comparator of FIG. 1 operates in an auto-zero mode.

FIG. 3 is a diagram illustrating an example in which a dual-mode comparator of FIG. 1 operates in an auto-zero mode.

Referring to FIGS. 1 and 3, the dual-mode comparator 100 may control the current mirror unit 140 to have the first structure in the auto-zero mode. When the dual-mode comparator 100 enters into the auto-zero mode, the first switch SW1 and the third switch SW3 of the mode switching unit 180 may turn-on in response to the auto-zero signal AZS, and the second switch SW2 of the mode switching unit 180 may turn-off in response to the comparison mode signal CMS.

The auto-zero signal AZS may be a signal having a logic low level, and the comparison mode signal CMS may be a signal having a logic high level in the auto-zero mode of the dual-mode comparator 100 because it is illustrated that the first through third switches SW1, SW2, and SW3 are PMOS transistors in FIG. 1

In the auto-zero mode, the dual-mode comparator 100 may have a structure in which the gate electrode of the third transistor T3 and the gate electrode of the fourth transistor T4 are coupled to the drain electrode of the third transistor T3, and the drain electrode of the second transistor T2 is coupled to the gate electrode of the second transistor T2. As a result, the gate electrode of the first transistor T1 may act as the positive input terminal INP, and the gate electrode of the second transistor T2 may act as the negative input terminal INN, so that the dual-mode comparator 100 may perform the auto-zero operation to store an offset of the dual-mode comparator 100 in the capacitor C. When an offset of the dual-mode comparator 100 is stored in the capacitor C in the auto-zero mode, a comparison error due to an offset of the dual-mode comparator 100 may be eliminated when the first object voltage FOV is compared with the second object voltage SOV in the comparison mode.

Figure 4A:
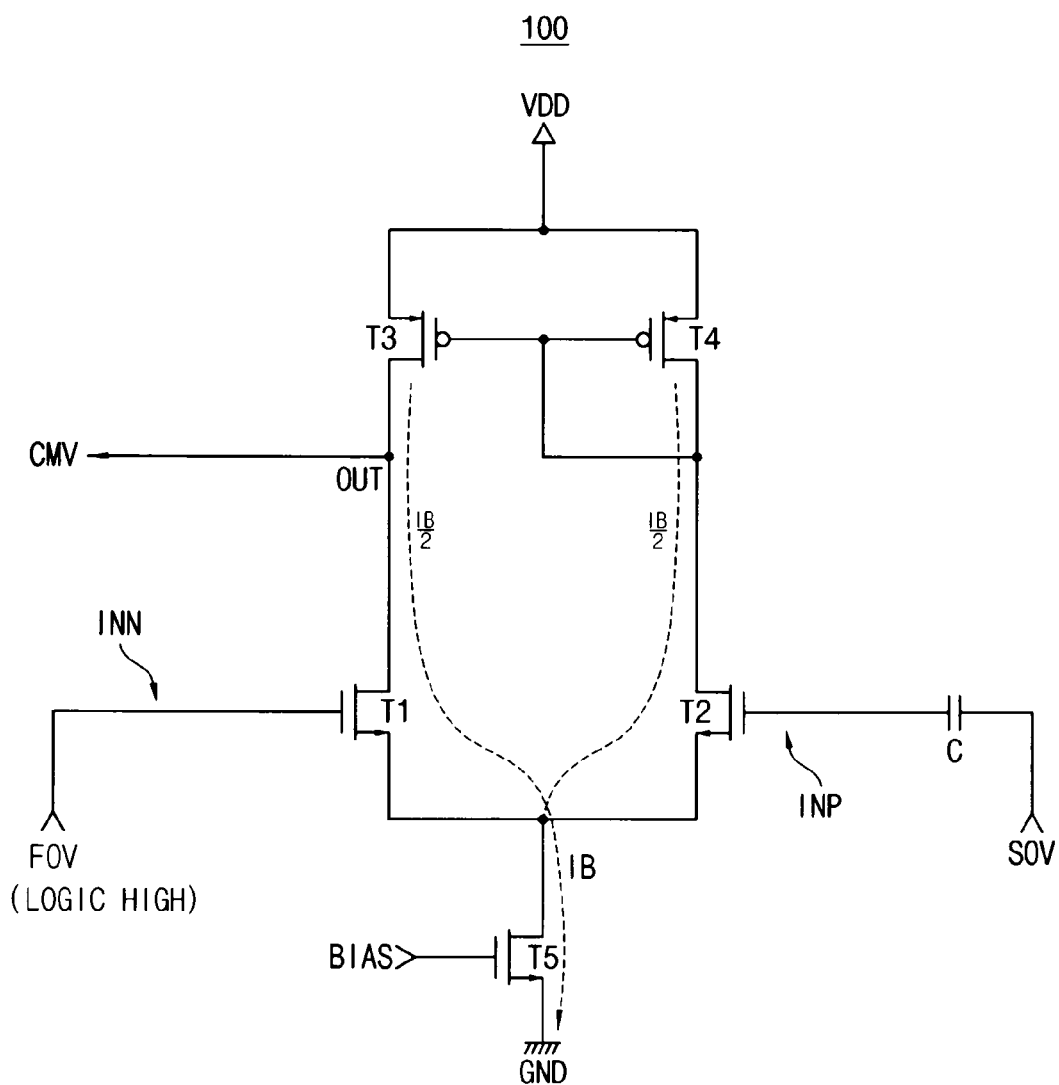
FIGS. 4A and 4B are diagrams illustrating an example in which a dual-mode comparator of FIG. 1 operates in a comparison mode.
Figure 4B:
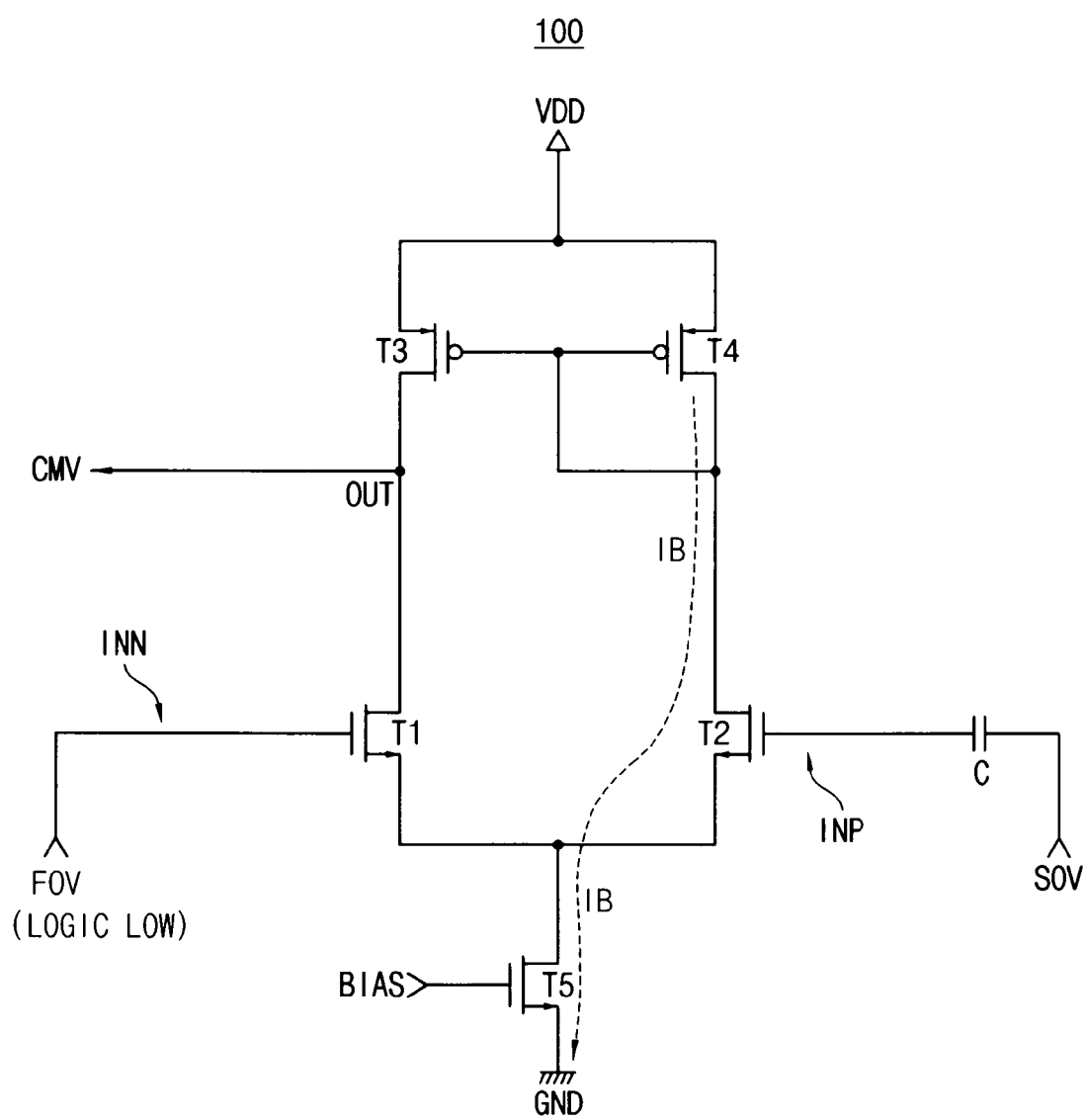

FIGS. 4A and 4B are diagrams illustrating an example in which a dual-mode comparator of FIG. 1 operates in a comparison mode.

Referring to FIGS. 1, 4A and 4B, the dual-mode comparator 100 may control the current mirror unit 140 such that the current mirror unit 140 has the second structure in the comparison mode. When the dual-mode comparator 100 enters into the comparison mode, the first switch SW1 and the third switch SW3 of the mode switching unit 180 may turn-off in response to the auto-zero signal AZS, and the second switch SW2 of the mode switching unit 180 may turn-on in response to the comparison mode signal CMS.

The auto-zero signal AZS may be a signal having a logic high level, and the comparison mode signal CMS may be a signal having a logic low level in the comparison mode of the dual-mode comparator 100 because it is illustrated that the first through third switches SW1, SW2, and SW3 are PMOS transistors in FIG. 1.

In the comparison mode, the dual-mode comparator 100 may have a structure in which the gate electrode of the third transistor T3 and the gate electrode of the fourth transistor T4 are coupled to the drain electrode of the fourth transistor T4, and the drain electrode of the second transistor T2 is decoupled from the gate electrode of the second transistor T2. In addition, the drain electrode of the third transistor T3 and the drain electrode of the fourth transistor T4 are coupled to the output terminal OUT, so that the comparison voltage CMV may be output at the output terminal OUT. As a result, the gate electrode of the first transistor T1 may act as the negative input terminal INN, and the gate electrode of the second transistor T2 may act as the positive input terminal INP. Therefore, in the comparison mode, the dual-mode comparator 100 may output the comparison voltage CMV corresponding to a voltage generated by amplifying a difference between the first object voltage FOV and the second object voltage SOV. As discussed supra, an offset of the dual-mode comparator 100 is stored in the capacitor C during the auto-zero mode. Therefore, a comparison error due to an offset of the dual-mode comparator 100 may be eliminated when the comparison voltage CMV is output in the comparison mode.

FIG. 4A shows a current (i.e., a bias current IB) consumed before the decision point in the comparison mode. Before the decision point, a signal having a logic low level is applied to the positive input terminal INP and a signal having a logic high level is applied to the negative input terminal INN. Therefore, the first current may flow through the first path on which the first transistor T1 and the third transistor T3 are placed, and the second current may flow through the second path on which the second transistor T2 and the fourth transistor T4 are placed. At this time, the sum of the first current and the second current may flow through the fifth transistor T5 as the bias current IB. Here, each of the first current flowing through the first path and the second current flowing through the second path may correspond to a half of the bias current IB.

FIG. 4B shows a current (i.e., a bias current IB) consumed after the decision point in the comparison mode. After the decision point, a signal having a logic high level is applied to the positive input terminal INP and a signal having a logic low level is applied to the negative input terminal INN. Therefore, the first current may not flow through the first path on which the first transistor T1 and the third transistor T3 are placed, and the second current may flow through the second path on which the second transistor T2 and the fourth transistor T4 are placed, to the fifth transistor T5.

The second current flowing through the fifth transistor T5 may be the bias current IB as shown in FIG. 4A. Hence, the dual-mode comparator 100 may maintain a current (i.e., the bias current IB) consumed before and after the decision point in the comparison mode. As a result, the dual-mode comparator 100 may prevent the power voltage fluctuation for a circuit (e.g., an analog to digital converter) including the dual-mode comparator 100.

Figure 5:
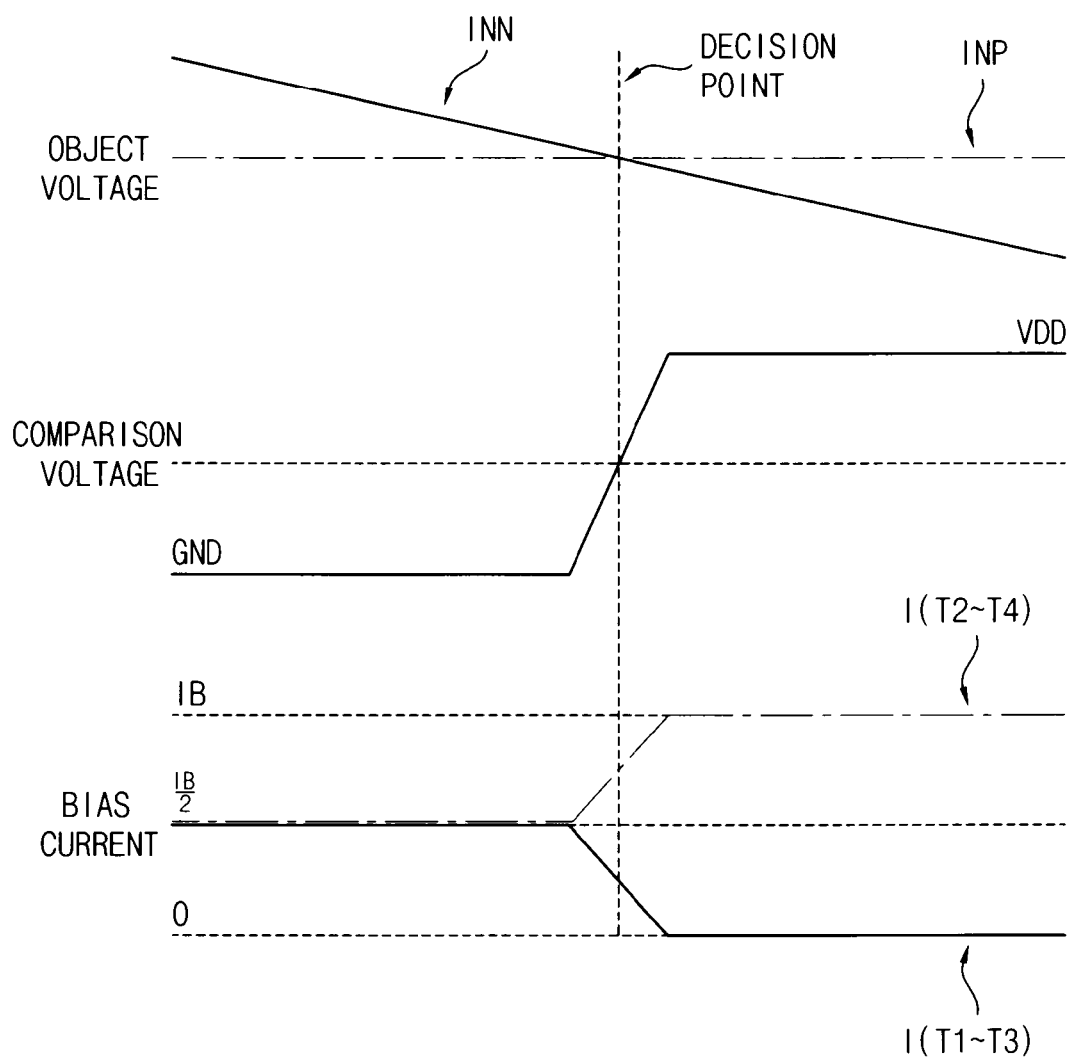
FIG. 5 is a timing diagram illustrating an example in which a dual-mode comparator of FIG. 1 operates in a comparison mode.

FIG. 5 is a timing diagram illustrating an example in which a dual-mode comparator of FIG. 1 operates in a comparison mode.

Referring to FIGS. 1 and 5, in the comparison mode of the dual-mode comparator 100, before the decision point of the dual-mode comparator 100, the first object voltage FOV applied to the negative input terminal INN is greater than the second object voltage SOV applied to the positive input terminal INP. On the other hand, after the decision point of the dual-mode comparator 100, the first object voltage FOV applied to the negative input terminal INN is smaller than the second object voltage SOV applied to the positive input terminal INP.

In one example embodiment, in case that the dual-mode comparator 100 is included in an analog to digital converter, the first object voltage FOV applied to the negative input terminal INN may correspond to a ramp voltage, and the second object voltage SOV applied to the positive input terminal INP may correspond to a pixel output voltage that is output from each pixel. For example, in the analog to digital converter, an analog signal (i.e., the pixel output voltage) may be converted into a digital signal by counting a clock signal until the decision point of the dual-mode comparator 100.

At the decision point of the dual-mode comparator 100, a polarity of the comparison voltage CMV output from the dual-mode comparator 100 may be changed because the first object voltage FOV is the same as the second object voltage SOV. Here, the dual-mode comparator 100 may maintain the bias current IB (i.e., the sum of the first current flowing through the first path and the second current flowing through the second path) before and after the decision point of the dual-mode comparator 100.

In detail, when the first object voltage FOV applied to the negative input terminal INN is greater than the second object voltage SOV applied to the positive input terminal INP, Each of the first current flowing through the first path and the second current flowing through the second path may correspond to a half of the bias current IB. On the other hand, when the first object voltage FOV applied to the negative input terminal INN is smaller than the second object voltage SOV applied to the positive input terminal INP, the second current flowing through the second path may correspond to the bias current IB (i.e., the first current does not flow through the first path). Therefore, the bias current IB (i.e., the sum of the first current flowing through the first path and the second current flowing through the second path) may be maintained before and after the decision point of the dual-mode comparator 100.

As described above, in the auto-zero mode, the dual-mode comparator 100 may have the first structure in which the gate electrode of the third transistor T3 and the gate electrode of the fourth transistor T4 are coupled to the drain electrode of the third transistor T3. On the other hand, in the comparison mode, the dual-mode comparator 100 may have the second structure in which the gate electrode of the third transistor T3 and the gate electrode of the fourth transistor T4 are coupled to the drain electrode of the fourth transistor T4. Thus, based on the first and second structures, the dual-mode comparator 100 may equalize a current (i.e., the bias current IB) consumed before the decision point with a current (i.e., the bias current IB) consumed after the decision point. As a result, the power voltage fluctuation may be prevented in a circuit (e.g., an analog to digital converter) including the dual-mode comparator 100.

In FIG. 5, it is described that the first and second object voltages FOV and SOV are the ramp voltage and the pixel output voltage, respectively. However, in case that the dual-mode comparator 100 is applied to a two-stage comparator, the first and second object voltages FOV and SOV may be a comparison voltage and a reference voltage, respectively, the comparison voltage corresponding to a voltage generated by amplifying a difference between the ramp voltage and the pixel output voltage.

FIG. 6 is a circuit diagram illustrating a dual-mode comparator according to an example embodiment.

Referring to FIG. 6, the dual-mode comparator 200 may include an object voltage input unit 220, a current mirror unit 240, a bias unit 260, and a mode switching unit 280. Since the object voltage input unit 220, the current mirror unit 240, and the bias unit 260 are described referring to FIG. 1, duplicated descriptions will be omitted below.

The mode switching unit 280 may control the current mirror unit 240 to have a first structure in an auto-zero mode, and may control the current mirror unit 240 to have a second structure in a comparison mode.

The first structure is a structure in which the gate electrode of the third transistor T3 and the gate electrode of the fourth transistor T4 are coupled to the drain electrode of the third transistor T3. The second structure is a structure in which the gate electrode of the third transistor T3 and the gate electrode of the fourth transistor T4 are coupled to the drain electrode of the fourth transistor T4.

In one example embodiment, the mode switching unit 280 may include a first switch SW1 and a second switch SW2. The first switch SW1 may turn-on in the auto-zero mode to couple the gate electrode of the third transistor T3 and the gate electrode of the fourth transistor T4 to the drain electrode of the third transistor T3. The second switch SW2 may turn-on in the comparison mode to couple the gate electrode of the third transistor T3 and the gate electrode of the fourth transistor T4 to the drain electrode of the fourth transistor T4. The first switch SW1 turns-off in the comparison mode, and the second switch SW2 turns-off in the auto-zero mode.

The mode switching unit 280 may further include a third switch SW3 that turns-on in the auto-zero mode to couple the gate electrode of the second transistor T2 to the drain electrode of the second transistor T2, and a fourth switch SW4 that turns-on in the auto-zero mode to couple the gate electrode of the first transistor T1 to the drain electrode of the first transistor T1. The third and fourth switches SW3 and SW4 turn-off in the comparison mode.

Although the first through fourth switches SW1, SW2, SW3, and SW4 are illustrated as PMOS transistors in FIG. 6, the first through fourth switches SW1, SW2, SW3, and SW4 are not limited thereto. For example, the first through fourth switches SW1, SW2, SW3, and SW4 may be replaced with any elements capable of performing a switching operation. Meanwhile, if the first through fourth switches SW1, SW2, SW3, and SW4 are PMOS transistors, the first through fourth switches SW1, SW2, SW3, and SW4 may turn-on when an auto-zero signal AZS and a comparison mode signal CMS have a logic low level.

An offset of the dual-mode comparator 200 may be eliminated because the drain electrode of the first transistor T1 is coupled to the gate electrode of the first transistor T1 and the drain electrode of the second transistor T2 is coupled to the gate electrode of the second transistor T2 when the gate electrode of the third transistor T3 and the gate electrode of the fourth transistor T4 are coupled to the drain electrode of the third transistor T3 in the auto-zero mode. Then, the gate electrode of the second transistor T2 may act as the positive input terminal INP, and the gate electrode of the first transistor T1 may act as the negative input terminal INN when the gate electrode of the third transistor T3 and the gate electrode of the fourth transistor T4 are coupled to the drain electrode of the fourth transistor T4 in the comparison mode.

In the auto-zero mode, the current mirror unit 240 has a structure in which the gate electrode of the third transistor T3 and the gate electrode of the fourth transistor T4 are coupled to the drain electrode of the third transistor T3. Thus, an auto-zero operation may be performed when the third and fourth switches SW3 and SW4 turn-on in response to the auto-zero signal AZS. When the third and fourth switches SW3 and Sw4 turn-on, an offset of the dual-mode comparator 200 is stored in the first and second capacitors C1 and C2, respectively.

In the comparison mode, a comparison error due to an offset of the dual-mode comparator 200 may be eliminated when a first object voltage FOV is compared with a second object voltage SOV when the offset is stored in the first and second capacitors C1 and C2. In addition, in the comparison mode, the current mirror unit 240 has a structure in which the gate electrode of the third transistor T3 and the gate electrode of the fourth transistor T4 are coupled to the drain electrode of the fourth transistor T4. Thus, a current (i.e., the bias current) consumed before a decision point of the dual-mode comparator 200 may be equalized with a current (i.e., the bias current) consumed after the decision point of the dual-mode comparator 200.

The decision point means a timing point at which signals applied to the positive input terminal INP and the negative input terminal INN are changed from a logic low level to a logic high level or from a logic high level to a logic low level. Thus, the dual-mode comparator 200 may prevent the power voltage fluctuation for a circuit including the dual-mode comparator 200.

Figure 7:
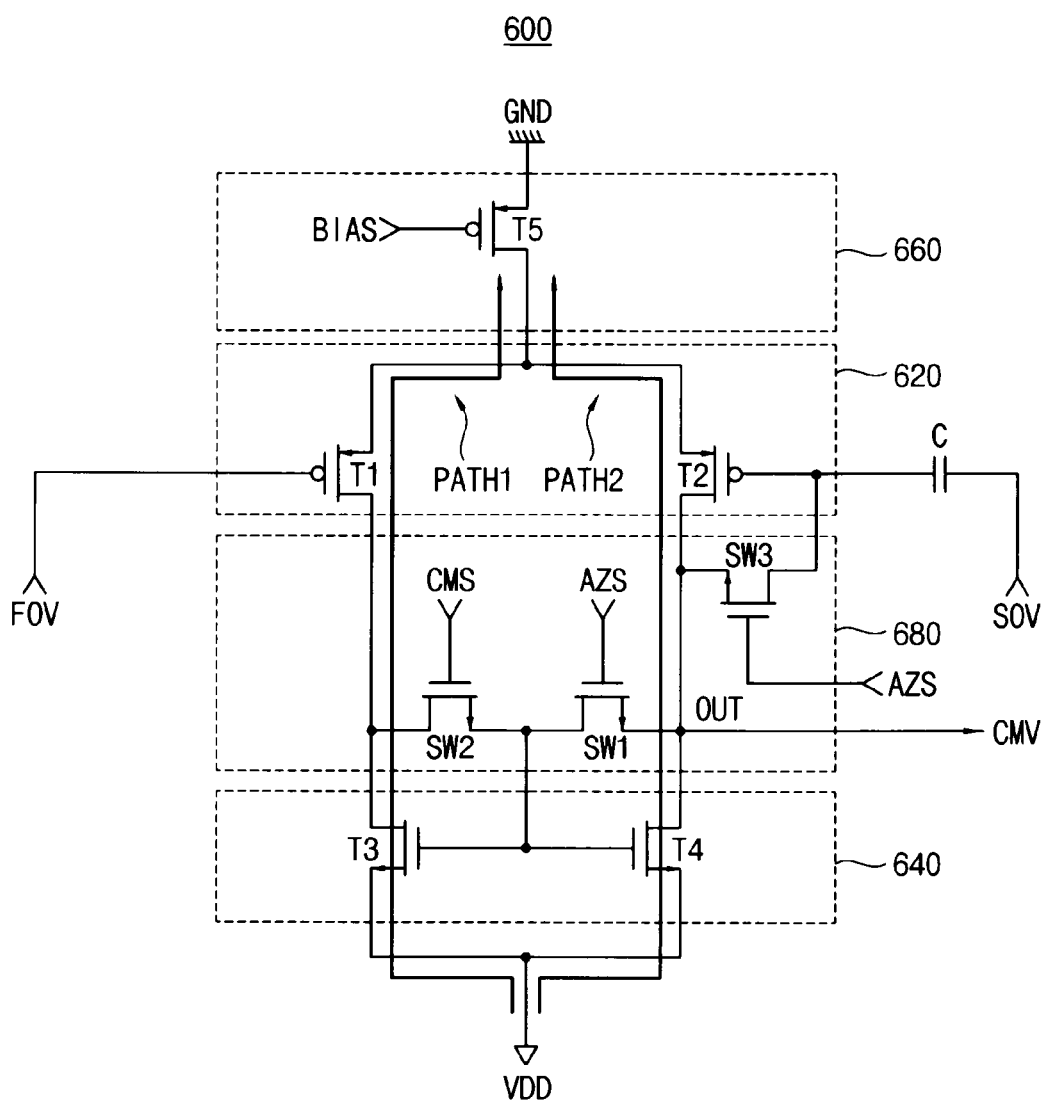
FIG. 7 is a circuit diagram illustrating a dual-mode comparator according to an example embodiment.

FIG. 7 is a circuit diagram illustrating a dual-mode comparator according to an example embodiment.

Referring to FIG. 7, the dual-mode comparator 600 may include an object voltage input unit 620, a current mirror unit 640, a bias unit 660, and a mode switching unit 680.

The target voltage input unit 620 may generate a first current flowing through a first path PATH1 and a second current flowing through a second path PATH2 based on a first object voltage FOV and a second object voltage SOV.

The first path PATH1 indicates a route on which a first transistor T1 and a third transistor T3 are placed, the first transistor T1 and the third transistor T3 being coupled between a first supply voltage VDD and a second supply voltage GND. The second path PATH2 indicates a route on which a second transistor T2 and a fourth transistor T4 are placed, the second transistor T2 and the fourth transistor T4 being coupled between the first supply voltage VDD and the second supply voltage GND. The first supply voltage VDD may correspond to a power source voltage, and the second supply voltage GND may correspond to a ground voltage.

In one example embodiment, the target voltage input unit 620 may include the first transistor T1 that allows the first current to flow through the first path PATH1 based on the first object voltage FOV, and the second transistor T2 that allows the second current to flow through the second path PATH2 based on the second object voltage SOV. As illustrated in FIG. 7, a gate electrode of the first transistor T1 may be coupled to the first object voltage FOV, a source electrode of the first transistor T1 may be coupled to a drain electrode of the fifth transistor T5, and a drain electrode of the first transistor T1 may be coupled to a drain electrode of the third transistor T3. In addition, a gate electrode of the second transistor T2 may be coupled to the second object voltage SOV, a source electrode of the second transistor T2 may be coupled to the drain electrode of the fifth transistor T5, and a drain electrode of the second transistor T2 may be coupled to a drain electrode of the fourth transistor T4. Here, the first and second transistors T1 and T2 may be PMOS transistors. However, the first and second transistors T1 and T2 are not limited thereto.

A capacitor C may be coupled to the gate electrode of the second transistor T2. The capacitor C may eliminate Direct-Current (DC) components when the second object voltage SOV is applied to the second transistor T2. According to some example embodiments, a capacitor C may be also coupled to the gate electrode of the first transistor T1 to eliminate DC components when the first object voltage FOV is applied to the first transistor T1.

The current mirror unit 640 may perform a current-mirror operation for the first path PATH1 and the second path PATH2, and may output a comparison voltage CMV at an output terminal OUT.

As illustrated in FIG. 7, the gate electrode of the third transistor T3 may be coupled to the gate electrode of the fourth transistor T4, the source electrode of the third transistor T3 may be coupled to the first supply voltage VDD, and the drain electrode of the third transistor T3 may be coupled to the drain electrode of the first transistor T1. In addition, the gate electrode of the fourth transistor T4 may be coupled to the gate electrode of the third transistor T3, the source electrode of the fourth transistor T4 may be coupled to the first supply voltage VDD, and the drain electrode of the fourth transistor T4 may be coupled to the drain electrode of the second transistor T2.

The third and fourth transistors T3 and T4 may be NMOS transistors. However, the third and fourth transistors T3 and T4 are not limited thereto. Further, the output terminal OUT may correspond to the drain electrode of the fourth transistor T4 and the drain electrode of the second transistor T2. Thus, the comparison voltage CMV corresponding to a voltage generated by amplifying a difference between the first object voltage FOV and the second object voltage SOV may be output at the output terminal OUT. In an auto-zero mode, the gate electrode of the third transistor T3 and the gate electrode of the fourth transistor T4 may be coupled to the drain electrode of the third transistor T3. In a comparison mode, the gate electrode of the third transistor T3 and the gate electrode of the fourth transistor T4 may be coupled to the drain electrode of the fourth transistor T4. As a result, the current mirror unit 640 may have a structure capable of performing the current-mirror operation for the first path PATH1 and the second path PATH2.

The bias unit 660 may generate a bias current corresponding to a sum of the first current flowing through the first path PATH1 and the second current flowing through the second path PATH2. In one example embodiment, the bias unit 660 may include the fifth transistor T5 that receives a bias voltage BIAS to generate the bias current. The fifth transistor T5 may be a PMOS transistor. However, the fifth transistor T5 is not limited thereto.

As illustrated in FIG. 7, the gate electrode of the fifth transistor T5 may be coupled to the bias voltage BIAS, the source electrode of the fifth transistor T5 may be coupled to the second supply voltage GND, and the drain electrode of the fifth transistor T5 may be coupled to the source electrode of the first transistor T1 and the source electrode of the second transistor T2. Thus, the bias unit 660 may act as a current source for the dual-mode comparator 200.

The mode switching unit 680 may control the current mirror unit 640 to have a first structure in the auto-zero mode, and may control the current mirror unit 640 to have a second structure in the comparison mode.

The first structure is a structure in which the gate electrode of the third transistor T3 and the gate electrode of the fourth transistor T4 are coupled to the drain electrode of the fourth transistor T4. The second structure is a structure in which the gate electrode of the third transistor T3 and the gate electrode of the fourth transistor T4 are coupled to the drain electrode of the third transistor T3.

In one example embodiment, the mode switching unit 680 may include a first switch SW1 and a second switch SW2. The first switch SW1 may turn-on in the auto-zero mode to couple the gate electrode of the third transistor T3 and the gate electrode of the fourth transistor T4 to the drain electrode of the fourth transistor T4. The second switch SW2 may turn-on in the comparison mode to couple the gate electrode of the third transistor T3 and the gate electrode of the fourth transistor T4 to the drain electrode of the third transistor T3. The first switch SW1 turns-off in the comparison mode, and the second switch SW2 turns-off in the auto-zero mode.

The mode switching unit 680 may further include a third switch SW3 that turns-on in the auto-zero mode to couple the gate electrode of the second transistor T2 to the drain electrode of the second transistor T2, and that turns-off in the comparison mode. The third switch SW3 may eliminate an offset of the dual-mode comparator 600 by coupling the drain electrode of the second transistor T2 to the gate electrode of the second transistor T2 when the gate electrode of the third transistor T3 and the gate electrode of the fourth transistor T4 are coupled to the drain electrode of the fourth transistor T4 in the auto-zero mode.

Although the first through third switches SW1, SW2, and SW3 are illustrated as NMOS transistors in FIG. 7, the first through third switches SW1, SW2, and SW3 are not limited thereto. For example, the first through third switches SW1, SW2, and SW3 may be replaced with any elements capable of performing a switching operation. Meanwhile, if the first through third switches SW1, SW2, and SW3 are NMOS transistors, the first through third switches SW1, SW2, and SW3 may turn-on when an auto-zero signal AZS and a comparison mode signal CMS have a logic high level.

As described above, the dual-mode comparator 600 may include the object voltage input unit 620, the current mirror unit 640, and the bias unit 660, and may further include the mode switching unit 680 that changes a structure of the current mirror unit 640 according to operation modes (i.e., the auto-zero mode and the comparison mode). The mode switching unit 680 may control the current mirror unit 640 to have the first structure in the auto-zero mode, and may control the current mirror unit 640 to have the second structure in the comparison mode.

An offset of the dual-mode comparator 600 may be eliminated because the drain electrode of the second transistor T2 is coupled to the gate electrode of the second transistor T2 when the gate electrode of the third transistor T3 and the gate electrode of the fourth transistor T4 are coupled to the drain electrode of the fourth transistor T4 in the auto-zero mode. In addition, a comparison operation between the first object voltage FOV and the second object voltage SOV may be properly performed because the gate electrode of the second transistor T2 acts as the negative input terminal INN and the gate electrode of the first transistor T1 acts as the positive input terminal INP when the gate electrode of the third transistor T3 and the gate electrode of the fourth transistor T4 are coupled to the drain electrode of the third transistor T3 in the comparison mode.

The dual-mode comparator 600 may equalize a current consumed before a decision point of the dual-mode comparator 600 with a current consumed after the decision point of the dual-mode comparator 600. The decision point being a timing point at which signals applied to the positive input terminal INP and the negative input terminal INN are changed from a logic low level to a logic high level or from a logic high level to a logic low level. Thus, the dual-mode comparator 600 may prevent the power voltage fluctuation for a circuit including the dual-mode comparator 600 by having a structure capable of performing an auto-zero operation in the auto-zero mode, and by having a structure capable of maintaining the bias current before and after the decision point in the comparison mode.

Figure 8:
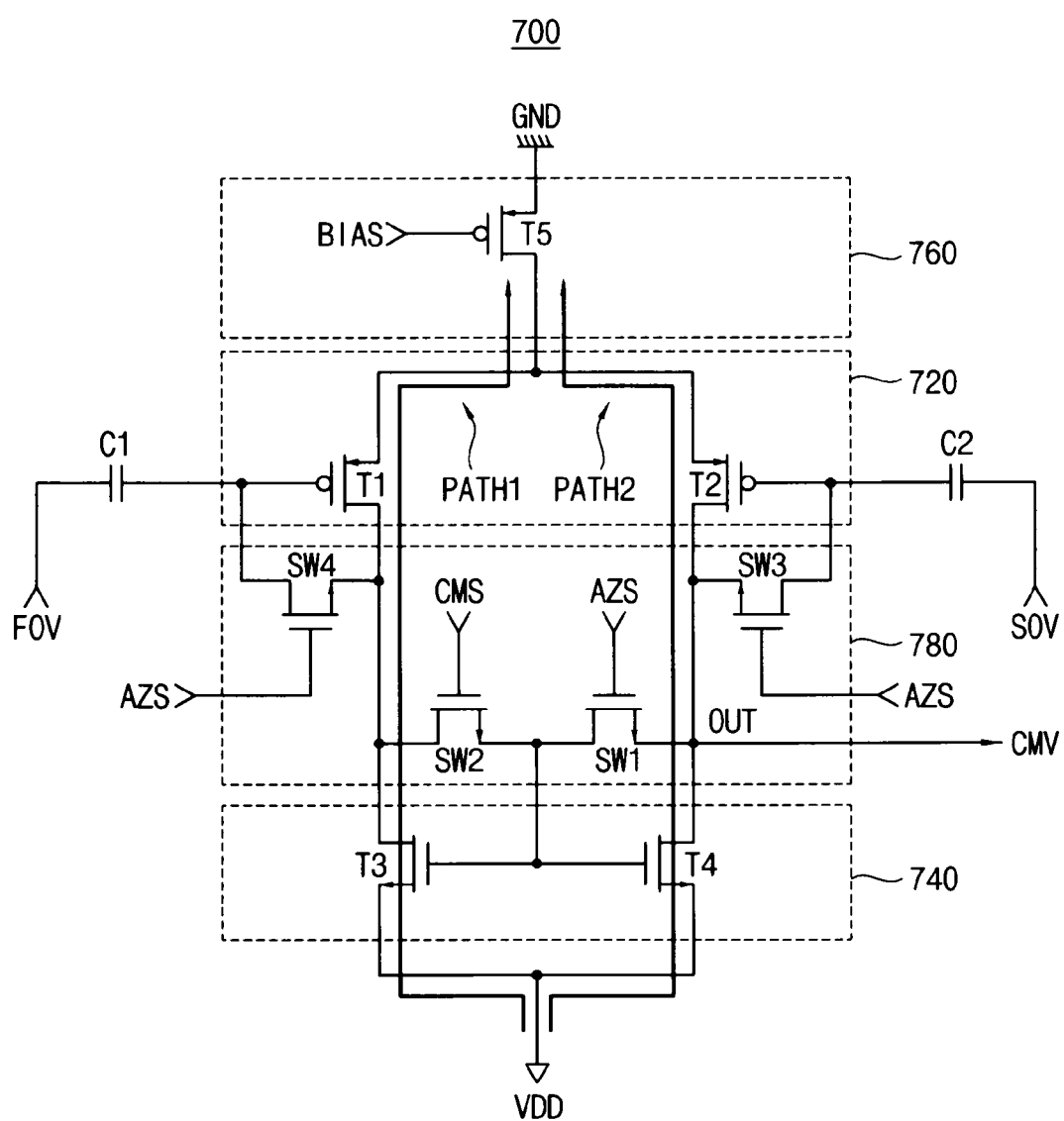
FIG. 8 is a circuit diagram illustrating a dual-mode comparator according to an example embodiment.

FIG. 8 is a circuit diagram illustrating a dual-mode comparator according to an example embodiment.

Referring to FIG. 8, the dual-mode comparator 700 may include an object voltage input unit 720, a current mirror unit 740, a bias unit 760, and a mode switching unit 780. Since the object voltage input unit 720, the current mirror unit 740, and the bias unit 760 are described referring to FIG. 7, duplicated descriptions will be omitted below.

The mode switching unit 780 may control the current mirror unit 740 to have a first structure in an auto-zero mode, and may control the current mirror unit 740 to have a second structure in a comparison mode.

The first structure is a structure in which the gate electrode of the third transistor T3 and the gate electrode of the fourth transistor T4 are coupled to the drain electrode of the fourth transistor T4. The second structure is a structure in which the gate electrode of the third transistor T3 and the gate electrode of the fourth transistor T4 are coupled to the drain electrode of the third transistor T3.

In one example embodiment, the mode switching unit 780 may include a first switch SW1 and a second switch SW2. The first switch S1 may turn-on in the auto-zero mode to couple the gate electrode of the third transistor T3 and the gate electrode of the fourth transistor T4 to the drain electrode of the fourth transistor T4. The second switch SW2 may turn-on in the comparison mode to couple the gate electrode of the third transistor T3 and the gate electrode of the fourth transistor T4 to the drain electrode of the third transistor T3. The first switch SW1 may turn-off in the comparison mode, and the second switch SW2 may turn-off in the auto-zero mode.

The mode switching unit 780 may further include a third switch SW3 and a fourth switch SW4. The third switch SW3 may turn-on in the auto-zero mode to couple the gate electrode of the second transistor T2 to the drain electrode of the second transistor T2. The fourth switch SW4 may turn-on in the auto-zero mode to couple the gate electrode of the first transistor T1 to the drain electrode of the first transistor T1. The third and fourth switches SW3 and SW4 may turn-off in the comparison mode.

Although the first through fourth switches SW1, SW2, SW3, and SW4 are illustrated as NMOS transistors in FIG. 8, the first through fourth switches SW1, SW2, SW3, and SW4 are not limited thereto. For example, the first through fourth switches SW1, SW2, SW3, and SW4 may be replaced with any elements capable of performing a switching operation. Meanwhile, if the first through fourth switches SW1, SW2, SW3, and SW4 are NMOS transistors, the first through fourth switches SW1, SW2, SW3, and SW4 may turn-on when an auto-zero signal AZS and a comparison mode signal CMS have a logic high level.

An offset of the dual-mode comparator 700 may be eliminated because the drain electrode of the first transistor T1 is coupled to the gate electrode of the first transistor T1 and the drain electrode of the second transistor T2 is coupled to the gate electrode of the second transistor T2 when the gate electrode of the third transistor T3 and the gate electrode of the fourth transistor T4 are coupled to the drain electrode of the fourth transistor T4 in the auto-zero mode. Then, the gate electrode of the second transistor T2 may act as the negative input terminal INN, and the gate electrode of the first transistor T1 may act as the positive input terminal INP when the gate electrode of the third transistor T3 and the gate electrode of the fourth transistor T4 are coupled to the drain electrode of the third transistor T3 in the comparison mode.

In the auto-zero mode, the current mirror unit 740 has a structure in which the gate electrode of the third transistor T3 and the gate electrode of the fourth transistor T4 are coupled to the drain electrode of the fourth transistor T4. Thus, an auto-zero operation may be performed when the third and fourth switches SW3 and SW4 turn-on in response to the auto-zero signal AZS. When the third and fourth switches SW3 and SW4 turn on, an offset of the dual-mode comparator 700 is stored in the first and second capacitors C1 and C2, respectively.

In the comparison mode, a comparison error due to an offset of the dual-mode comparator 700 may be eliminated when a first object voltage FOV is compared with a second object voltage SOV when the offset is stored in the first and second capacitors C1 and C2. In addition, in the comparison mode, the current mirror unit 740 has a structure in which the gate electrode of the third transistor T3 and the gate electrode of the fourth transistor T4 are coupled to the drain electrode of the third transistor T3. Thus, a current (i.e., the bias current IB) consumed before a decision point of the dual-mode comparator 700 may be equalized with a current (i.e., the bias current IB) consumed after the decision point of the dual-mode comparator 700.

The decision point means a timing point at which signals applied to the positive input terminal INP and the negative input terminal INN are changed from a logic low level to a logic high level or from a logic high level to a logic low level. Thus, the dual-mode comparator 700 may prevent the power voltage fluctuation for a circuit including the dual-mode comparator 700.

Figure 9:
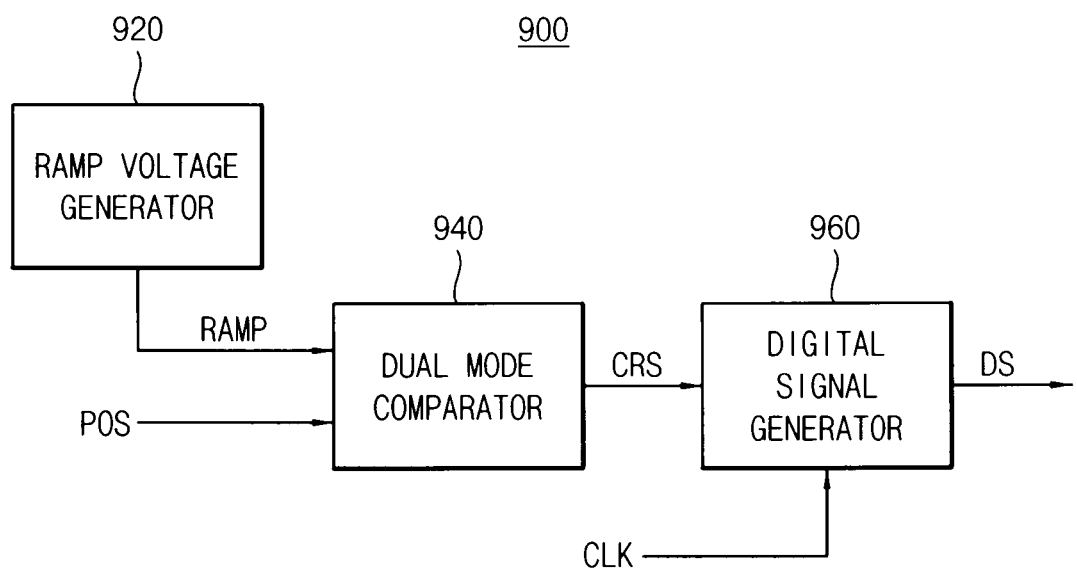
FIG. 9 is a block diagram illustrating an analog to digital converter according to an example embodiment.

FIG. 9 is a block diagram illustrating an analog to digital converter according to an example embodiment.

Referring to FIG. 9, the analog to digital converter 900 may include a ramp voltage generator 920, a dual-mode comparator 940, and a digital signal generator 960.

The ramp voltage generator 920 may generate a voltage ramp RAMP that is increased or decreased at a slope.

The dual-mode comparator 940 may have a structure that is changed according to operation modes (i.e., an auto-zero mode and a comparison mode), such that the dual-mode comparator 940 may perform an offset eliminating operation in the auto-zero mode, and may generate a comparison result signal CRS by comparing a pixel output voltage POS with the ramp voltage RAMP in the comparison mode. The comparison result signal CRS may correspond to a voltage generated by amplifying a difference between the pixel output voltage POS and the ramp voltage RAMP.

In one example embodiment, the dual-mode comparator 940 may include an object voltage input unit that generates a first current flowing through a first path and a second current flowing through a second path based on an first object voltage and a second object voltage, a current mirror unit that performs a current-mirror operation for the first path and the second path to output a comparison voltage at an output terminal, a bias unit that generates a bias current corresponding to a sum of the first current and the second current, and a mode switching unit that controls the current mirror unit to have a first structure in an auto-zero mode and to have a second structure in a comparison mode. Since the dual-mode comparator 940 is similar to the dual-mode comparator described above, duplicated descriptions will be omitted.

The digital signal generator 960 may generate a digital signal DS corresponding to the pixel output voltage POS based on the comparison result signal CRS by a clock signal counting method. For example, the digital signal generator 960 may generate the digital signal DS corresponding to the pixel output voltage POS by counting a clock signal CLK until the ramp voltage RAMP is the same as the pixel output voltage POS.

In one example embodiment, the digital signal generator 960 may include a counter unit that counts the clock signal CLK based on the comparison result signal CRS, and a bit processing unit that processes a bit generated by the counter unit. Although it is illustrated that the clock signal CLK is input to the digital signal generator 960, any circuit for generating the clock signal CLK may be included in the digital signal generator 960.

According to some example embodiments, the analog to digital converter 900 may reduce a time for generating the digital signal DS corresponding to the pixel output voltage POS by dividing a comparison operation into a coarse comparison operation and a fine comparison operation when the pixel output voltage POS is compared with the ramp voltage RAMP. In this case, the digital signal DS may be divided into the most significant bits (MSBs) and the least significant bits (LSBs). That is, the analog to digital converter 900 may calculate the most significant bits in the coarse comparison mode, may calculate the least significant bits in the fine comparison mode, and may generate the digital signal DS by summing the most significant bits and the least significant bits. For example, it is assumed that the pixel output voltage POS is converted into the digital signal DS of 8 bits, the most significant bits of 4 bits may be calculated in the coarse comparison mode, and the least significant bits of 4 bits may be calculated in the fine comparison mode. Then, the analog to digital converter 900 may output the digital signal DS by summing the most significant bits and the least significant bits. As a result, a digital signal processor (DSP) may display an image corresponding to the digital signal DS on a display panel.

Generally, an image sensor includes a plurality of analog to digital converters, the number of the analog to digital converters being the same as the number of column-lines coupled to an active pixel array, in order to convert the pixel output voltage POS to the digital signal DS. In addition, the column-lines coupled to the active pixel array are coupled to the analog to digital converters, respectively.

Although a relatively small power voltage fluctuation is caused in the analog to digital converter, the image sensor may be influenced by a relatively large power voltage fluctuation because the image sensor includes a plurality of analog to digital converters. For instance, in case that the power voltage fluctuation is caused in each of the analog to digital converters coupled to each of the column-lines, the power voltage fluctuation on column-lines related to a relatively dark region of an image may influence on column-lines related to a relatively bright region of the image. In this case, a band noise is generated in a row direction so that a quality of the image output from the image sensor may be degraded.

The analog to digital converter 900 may prevent the power voltage fluctuation because the analog to digital converter 800 includes the dual-mode comparator 940 capable of maintaining a current (i.e., a bias current) consumed before and after the decision point of the dual-mode comparator 940 when the pixel output voltage POS is compared with the ramp voltage RAMP.

Thus, an image sensor having the analog to digital converter 800 may output an image having a high quality. Further, the analog to digital converter 800 may be applied to a high-resolution image sensor because the dual-mode comparator 840 has a simple structure. Although it is described above that the analog to digital converter 800 is implemented by a column analog to digital converting manner, it is not limited thereto.

Figure 10:
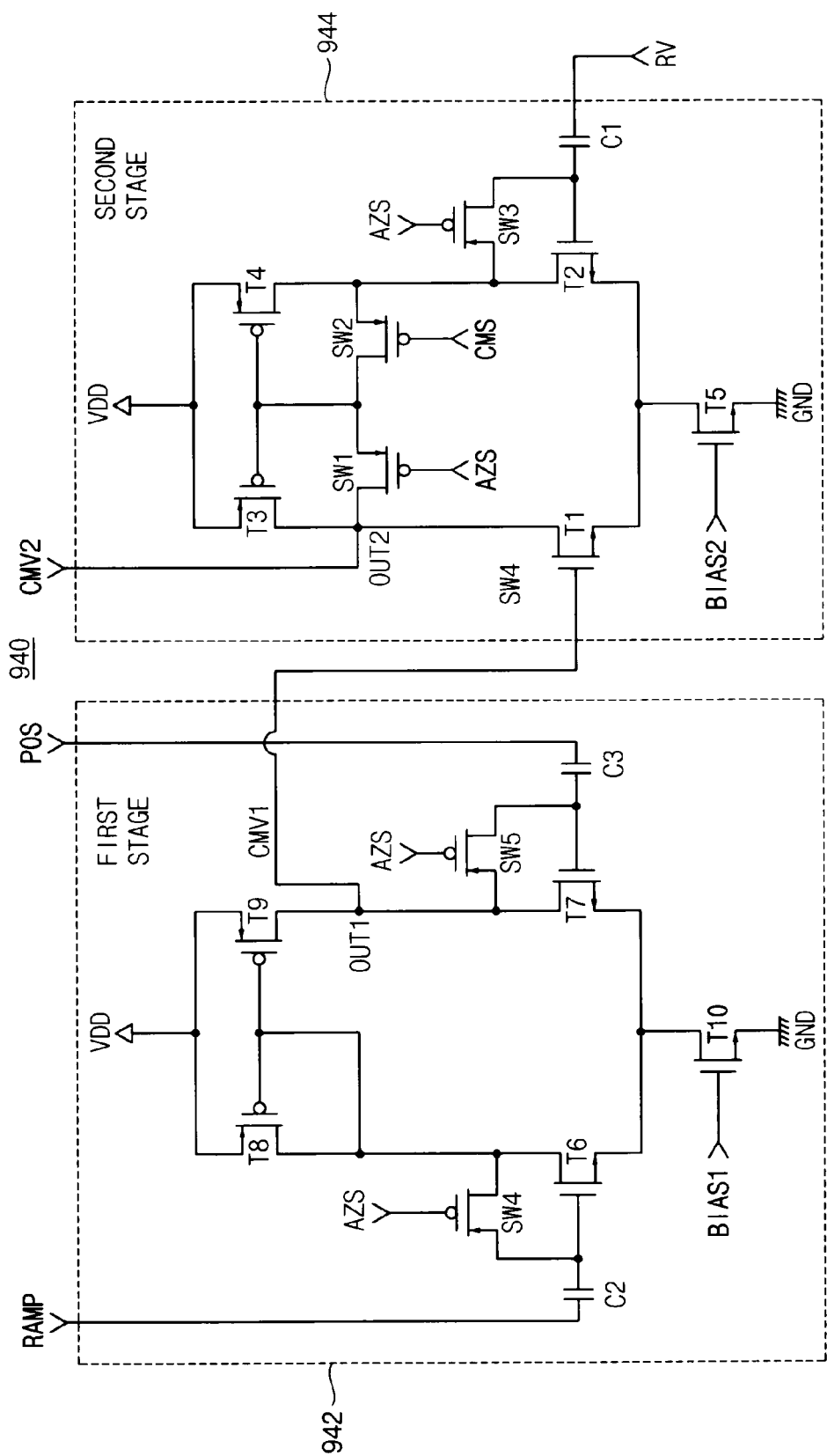
FIG. 10 is a circuit diagram illustrating an example of a dual-mode comparator included in an analog to digital converter of FIG. 9.

FIG. 10 is a circuit diagram illustrating an example of a dual-mode comparator included in an analog to digital converter of FIG. 9.

Referring to FIG. 10, the dual-mode comparator 940 may be a two-stage comparator including a first comparator 942 and a second comparator 944. In one example embodiment, the first comparator may compare a ramp voltage RAMP with a pixel output voltage POS, and may output a first comparison voltage CMV1 corresponding to the comparison result to the second comparator 944. Then, the second comparator 944 may compare the first comparison voltage CMV1 with a reference voltage RV, and may generate a second comparison voltage CMV2 corresponding to the comparison result. The first comparator 942 may output the first comparison voltage CMV1, the first comparison voltage CMV1 corresponding a voltage generated by amplifying a difference between the ramp voltage RAMP and the pixel output voltage POS, to the second comparator 944. As the first comparator 942 outputs the first comparison voltage CMV1, the second comparator 944 may output the second comparison voltage CMV2, the second comparison voltage CMV2 corresponding to a voltage generated by amplifying a difference between the first comparison voltage CMV1 with the reference voltage RV. Thus, the dual-mode comparator 040 of FIG. 10 may achieve a relatively large operation margin compared to a single comparator.

The first comparator 942 may include a first object voltage input unit that generates a first current flowing through a first path and a second current flowing through a second path based on the ramp voltage RAMP and the pixel output voltage POS, a first current mirror unit that performs a current-mirror operation for the first path and the second path and outputs the first comparison voltage CMV at a first output terminal OUT1, a first bias unit that generates a bias current corresponding to a sum of the first current and the second current, and an auto-zero unit that performs an auto-zero operation based on an auto-zero signal AZS. Here, the first object voltage input unit may include a sixth transistor T6 and a seventh transistor T7, the first current mirror unit may include a eighth transistor T8 and a ninth transistor T9, the first bias unit may include a tenth transistor T10, and the auto-zero unit may include a fourth switch SW4 and/or a fifth switch SW5. The second comparator 944 may include a second object voltage input unit that generates a first current flowing through a first path and a second current flowing through a second path based on the first comparison voltage CMV1 and the reference voltage RV, a second current mirror unit that performs a current-mirror operation for the first path and the second path and outputs the second comparison voltage CMV2 at a second output terminal OUT2, a second bias unit that generates a bias current corresponding to a sum of the first current and the second current, and a mode switching unit that controls the second current mirror unit to have a first structure in an auto-zero mode and to have a second structure in a comparison mode. Here, the second object voltage input unit may include a first transistor T1 and a second transistor T2, the second current mirror unit may include a third transistor T3 and a fourth transistor T4, the second bias unit may include a fifth transistor T5, and the mode switching unit may include a first switch SW1, a second switch SW2, and a third switch SW3.

In detail, a gate electrode of the sixth transistor T6 may be coupled to the ramp voltage RAMP, a source electrode of the sixth transistor T6 may be coupled to a drain electrode of the tenth transistor T10, and a drain electrode of the sixth transistor T6 may be coupled to a drain electrode of the eighth transistor T8. In addition, a gate electrode of the seventh transistor T7 may be coupled to the pixel output voltage POS, a source electrode of the seventh transistor T7 may be coupled to the drain electrode of the tenth transistor T10, and a drain electrode of the seventh transistor T7 may be coupled to a drain electrode of the ninth transistor T9. Here, the sixth and seventh transistors T6 and T7 may be NMOS transistors. However, the sixth and seventh transistors T6 and T7 are not limited thereto. Meanwhile, the gate electrode of the sixth transistor T6 may be coupled to a second capacitor C2, and the gate electrode of the seventh transistor T7 may be coupled to a third capacitor C3. The second and third capacitors C3 and C3 may eliminate DC components when the ramp voltage RAMP and the pixel output voltage POS are applied to the sixth and seventh transistors T6 and T7. In addition, a gate electrode of the eighth transistor T8 may be coupled to a gate electrode of the ninth transistor T9, a source electrode of the eighth transistor T8 may be coupled to a first supply voltage VDD, and a drain electrode of the eighth transistor T8 may be coupled to the drain electrode of the sixth transistor T6. Further, a gate electrode of the ninth transistor T9 may be coupled to the gate electrode of the eighth transistor T8, a source electrode of the ninth transistor T9 may be coupled to the first supply voltage VDD, and a drain electrode of the ninth transistor T9 may be coupled to the drain electrode of the seventh transistor T7. Here, the eighth and ninth transistors T8 and T9 may be PMOS transistors. However, the eighth and ninth transistors T8 and T9 are not limited thereto. The gate electrode of the eighth transistor T8 and the gate electrode of the ninth transistor T9 may be coupled to the drain electrode of the eighth transistor T8, and the drain electrode of the ninth transistor T9 may be coupled to the first output terminal OUT1. The first comparison voltage CMV1 corresponding to a voltage generated by amplifying a difference between the ramp voltage RAMP and the pixel output voltage POS may be output at the first output terminal OUT1.

A gate electrode of the tenth transistor T10 may be coupled to a first bias voltage BIAS1, a source electrode of the tenth transistor T10 may be coupled to a second supply voltage GND, and a drain electrode of the tenth transistor T10 may be coupled to the source electrode of the sixth transistor T6 and the source electrode of the seventh transistor T7. Here, the tenth transistor T10 may be a NMOS transistor. However, the tenth transistor T10 is not limited thereto. Meanwhile, the first supply voltage may correspond to a power voltage, and the second supply voltage GND may correspond to a ground voltage. Thus, the tenth transistor T10 may act as a current source for the first comparator 942. The fourth switch SW4 may be coupled between the gate electrode and the drain electrode of the sixth transistor T6. The fifth switch SW5 may be coupled between the gate electrode and the drain electrode of the seventh transistor T7. In the auto-zero mode, when the fourth and fifth switches SW4 and SW5 turn-on in response to an auto-zero signal AZS, the gate electrode of the sixth transistor T6 may be coupled to the drain electrode of the sixth transistor T6, and the gate electrode of the seventh transistor T7 may be coupled to the drain electrode of the seventh transistor T7. As a result, since an offset of the first comparator 942 is stored in the second and third capacitors C2 and C3, a comparison error due to an offset of the first comparator 942 may be eliminated when the first comparator 942 compares the ramp voltage RAMP with the pixel output voltage POS in the comparison mode. Although it is illustrated that the fourth and fifth switches SW4 and SW5 are PMOS transistors, the fourth and fifth switches SW4 and SW5 are not limited thereto. For example, the fourth and fifth switches SW4 and SW5 may be replaced with any elements capable of performing a switching operation. Meanwhile, if the fourth and fifth switches SW4 and SW5 are PMOS transistors, the fourth and fifth switches SW4 and SW5 may turn-on when the auto-zero signal AZS has a logic low level.

Further, a gate electrode of the first transistor T1 may be coupled to the first comparison voltage CMV1, a source electrode of the first transistor T1 may be coupled to a drain electrode of the fifth transistor T5, and a drain electrode of the first transistor T1 may be coupled to a drain electrode of the third transistor T3. A gate electrode of the second transistor T2 may be coupled to the reference voltage RV, a source electrode of the second transistor T2 may be coupled to the drain electrode of the fifth transistor T5, and a drain electrode of the second transistor T2 may be coupled to a drain electrode of the fourth transistor T4. Here, the first and second transistors T1 and T2 may be NMOS transistors. However, the first and second transistors T1 and T2 are not limited thereto. Meanwhile, the gate electrode of the second transistor T2 may be coupled to a first capacitor C1. The first capacitor C1 may eliminate DC components when the reference voltage RV is applied to the second transistor T2. In addition, a gate electrode of the third transistor T3 may be coupled to a gate electrode of the fourth transistor T4, a source electrode of the third transistor T3 may be coupled to the first supply voltage VDD, and a drain electrode of the third transistor T3 may be coupled to the drain electrode of the first transistor T1. Further, a gate electrode of the fourth transistor T4 may be coupled to the gate electrode of the third transistor T3, a source electrode of the fourth transistor T4 may be coupled to the first supply voltage VDD, and a drain electrode of the fourth transistor T4 may be coupled to the drain electrode of the second transistor T2. Here, the third and fourth transistors T3 and T4 may be PMOS transistors. However, the third and fourth transistors T3 and T4 are not limited thereto. Meanwhile, a second output terminal OUT2 may correspond to the drain electrode of the third transistor T3 and the drain electrode of the first transistor T1. The second comparison voltage CMV2 corresponding to a voltage generated by amplifying a difference between the first comparison voltage CMV1 and the reference voltage RV may output at the second output terminal OUT2. In addition, a gate electrode of the fifth transistor T5 may be coupled to a second bias voltage BIAS2, a source electrode of the fifth transistor T5 may be coupled to the second supply voltage GND, and a drain electrode of the fifth transistor T5 may be coupled to the source electrode of the first transistor T1 and the source electrode of the second transistor T2. Here, the fifth transistor T5 may be a NMOS transistor. However, the fifth transistor T5 is not limited thereto. Thus, the fifth transistor T5 may act as a current source for the second comparator 944.

By operations of the first and second switches SW1 and SW2, the gate electrode of the third transistor T3 and the gate electrode of the fourth transistor T4 are coupled to the drain electrode of the third transistor T3 in the auto-zero mode, and the gate electrode of the third transistor T3 and the gate electrode of the fourth transistor T4 are coupled to the drain electrode of the fourth transistor T4 in the comparison mode. The first switch SW1 may turn-on in the auto-zero mode to couple the gate electrode of the third transistor T3 and the gate electrode of the fourth transistor T4 to the drain electrode of the third transistor T3, and may turn-off in the comparison mode. The second switch SW2 may turn-on in the comparison mode to couple the gate electrode of the third transistor T3 and the gate electrode of the fourth transistor T4 to the drain electrode of the fourth transistor T4, and may turn-off in the auto-zero mode. Further, the third switch SW3 may turn-on in the auto-zero mode to couple the gate electrode of the second transistor T2 to the drain electrode of the second transistor T2, and may turn-off in the comparison mode. Although it is illustrated that the first through third switches SW1, SW2, and SW3 are PMOS transistors in FIG. 10, the first through third switches SW1, SW2, and SW3 are not limited thereto. For example, the first through third switches SW1, SW2, and SW3 may be replaced with any elements capable of performing a switching operation. Meanwhile, if the first through third switches SW1, SW2, and SW3 are PMOS transistors, the first through third switches SW1, SW2, and SW3 may turn-on when an auto-zero signal AZS and a comparison mode signal CMS have a logic low level.

As described above, the dual-mode comparator 940 may include the first comparator 942 and the second comparator 944. Here, the second comparator 944 may have a structure capable of performing an auto-zero operation in the auto-zero mode, and may have a structure capable of maintaining a current (i.e., a bias current) consumed before and after the decision point of the second comparator 944 in the comparison mode. As a result, the analog to digital converter 900 having the dual-mode comparator 940 may prevent a power voltage fluctuation. Although it is illustrated that the first comparator 942 has a telescopic structure in FIG. 10, a structure of the first comparator 942 in not limited thereto. For example, a structure of the first comparator 942 may be a folded-cascode structure, a current mirrored structure, etc.

According to some example embodiments, the first comparator 942 may have a structure capable of performing an auto-zero operation in the auto-zero mode, and may have a structure capable of maintaining a current (i.e., a bias current) consumed before and after the decision point of the first comparator 942 in the comparison mode. Further, since a structure of the second comparator 944 is exemplary, a structure of the second comparator 944 may be changed according to required conditions.

Figure 11:
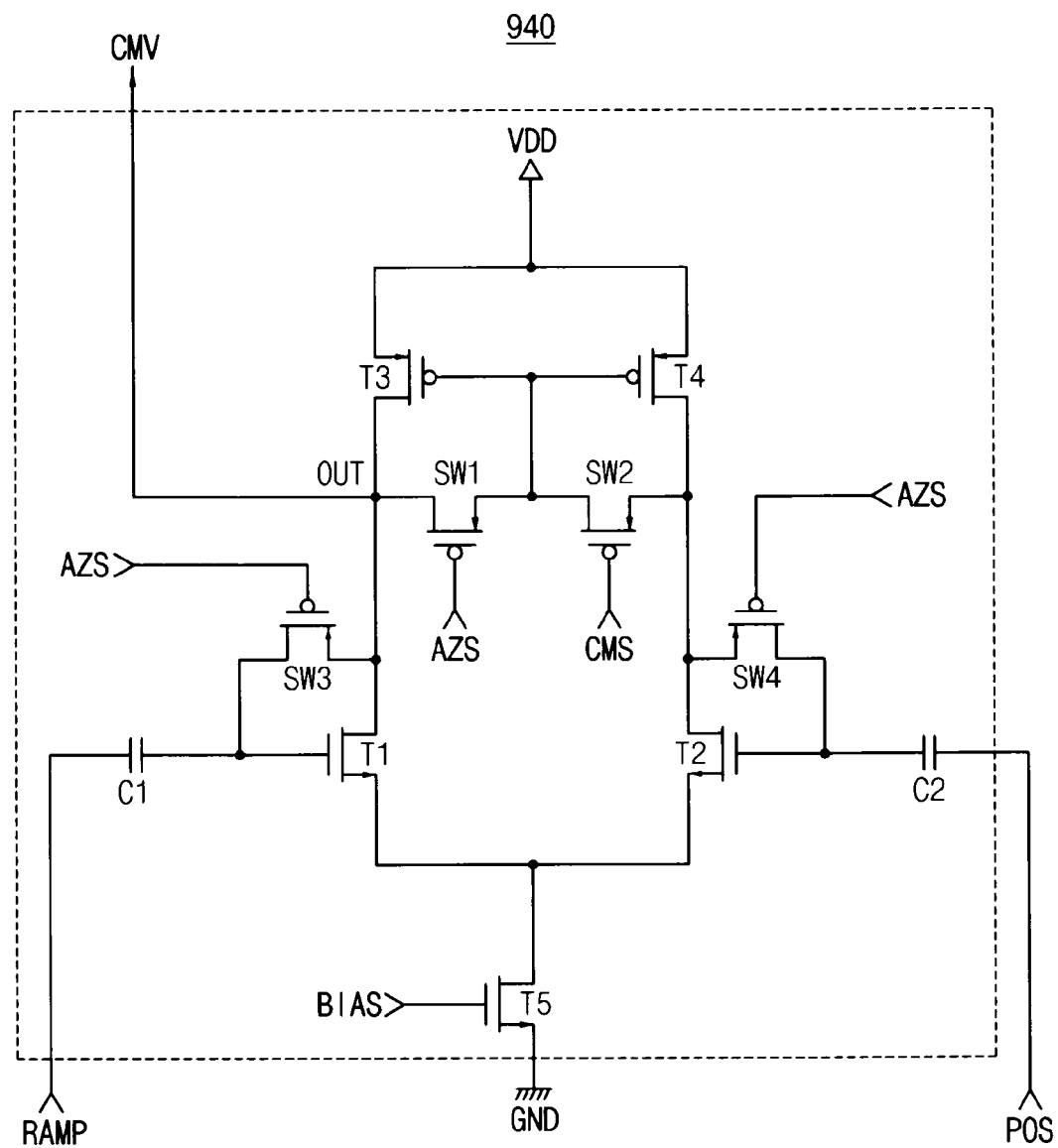
FIG. 11 is a circuit diagram illustrating another example of a dual-mode comparator included in an analog to digital converter of FIG. 9.

FIG. 11 is a circuit diagram illustrating another example of a dual-mode comparator included in an analog to digital converter of FIG. 9.

Referring to FIG. 11, the dual-mode comparator 940 may be a single comparator. In this case, the dual-mode comparator 940 may compare a pixel output voltage POS with a ramp voltage RAMP, and may output a comparison voltage CMV corresponding to the comparison result. That is, the dual-mode comparator 940 may generate the comparison voltage corresponding to a voltage generated by amplifying a difference between the ramp voltage RAMP and the pixel output voltage POS.

In one example embodiment, the dual-mode comparator 940 may include an object voltage input unit that generates a first current flowing through a first path and a second current flowing through a second path based on the ramp voltage RAMP and the pixel output voltage POS. The dual-mode comparator 940 may further include a current mirror unit that performs a current-mirror operation for the first path and the second path and outputs the comparison voltage CMV at an output terminal OUT, a bias unit that generates a bias current corresponding to a sum of the first current and the second current, and a mode switching unit that controls the current mirror unit to have a first structure in an auto-zero mode and to have a second structure in a comparison mode.

The object voltage input unit may include a first transistor T1 and a second transistor T2, the current mirror unit may include a third transistor T3 and a fourth transistor T4, the bias unit may include a fifth transistor T5, and the mode switching unit may include a first switch SW1, a second switch SW2, a third switch SW3, and a fourth switch SW4.

In detail, a gate electrode of the first transistor T1 may be coupled to the ramp voltage RAMP, a source electrode of the first transistor T1 may be coupled to a drain electrode of the fifth transistor T5, and a drain electrode of the first transistor T1 may be coupled to a drain electrode of the third transistor T3. In addition, a gate electrode of the second transistor T2 may be coupled to the pixel output voltage POS, a source electrode of the second transistor T2 may be coupled to the drain electrode of the fifth transistor T5, and a drain electrode of the second transistor T2 may be coupled to a drain electrode of the fourth transistor T4. Here, the first and second transistors T1 and T2 may be NMOS transistors. However, the first and second transistors T1 and T2 are not limited thereto.

The gate electrode of the first transistor T1 and the gate electrode of the second transistor T2 may be coupled to a first capacitor C1 and a second capacitor C2. The first and second capacitors C1 and C2 may eliminate DC components when the ramp voltage RAMP and the pixel output voltage POS are applied to the first and second transistors T1 and T2. In addition, a gate electrode of the third transistor T3 may be coupled to a gate electrode of the fourth transistor T4, a source electrode of the third transistor T3 may be coupled to a first supply voltage VDD, and a drain electrode of the third transistor T3 may be coupled to the drain electrode of the first transistor T1. Further, a gate electrode of the fourth transistor T4 may be coupled to the gate electrode of the third transistor T3, a source electrode of the fourth transistor T4 may be coupled to the first supply voltage VDD, and a drain electrode of the fourth transistor T4 may be coupled to the drain electrode of the second transistor T2. Here, the third and fourth transistors T3 and T4 may be PMOS transistors. However, the third and fourth transistors T3 and T4 are not limited thereto.

The output terminal OUT may be coupled to the drain electrode of the third transistor T3 and the drain electrode of the first transistor T1. The comparison voltage CMV corresponding to a voltage generated by amplifying a difference between the ramp voltage RAMP and the pixel output voltage POS may be output at the output terminal OUT.

A gate electrode of the fifth transistor T5 may be coupled to a bias voltage BIAS, a source electrode of the fifth transistor T5 may be coupled to a second supply voltage GND, and a drain electrode of the fifth transistor T5 may be coupled to the source electrode of the first transistor T1 and the source electrode of the second transistor T2. Here, the fifth transistor T5 may be a NMOS transistor. However, the fifth transistor T5 is not limited thereto. Thus, the fifth transistor T5 may act as a current source for the dual-mode comparator 940.

By operations of the first and second switches SW1 and SW2, the gate electrode of the third transistor T3 and the gate electrode of the fourth transistor T4 are coupled to the drain electrode of the third transistor T3 in the auto-zero mode, and the gate electrode of the third transistor T3 and the gate electrode of the fourth transistor T4 are coupled to the drain electrode of the fourth transistor T4 in the comparison mode.

The first switch SW1 may turn-on in the auto-zero mode to couple the gate electrode of the third transistor T3 and the gate electrode of the fourth transistor T4 to the drain electrode of the third transistor T3, and may turn-off in the comparison mode. The second switch SW2 may turn-on in the comparison mode to couple the gate electrode of the third transistor T3 and the gate electrode of the fourth transistor T4 to the drain electrode of the fourth transistor T4, and may turn-off in the auto-zero mode. Further, the third switch SW3 may turn-on in the auto-zero mode to couple the gate electrode of the first transistor T1 to the drain electrode of the first transistor T1, and may turn-off in the comparison mode. The fourth switch SW4 may turn-on in the auto-zero mode to couple the gate electrode of the second transistor T2 to the drain electrode of the second transistor T2, and may turn-off in the comparison mode.

Although it is illustrated that the first through fourth switches SW1, SW2, SW3, and SW4 are PMOS transistors in FIG. 11, the first through fourth switches SW1, SW2, SW3, and SW4 are not limited thereto. For example, the first through fourth switches SW1, SW2, SW3, and SW4 may be replaced with any elements capable of performing a switching operation. Meanwhile, if the first through fourth switches SW1, SW2, SW3, and SW4 are PMOS transistors, the first through fourth switches SW1, SW2, SW3, and SW4 may turn-on when an auto-zero signal AZS and a comparison mode signal CMS have a logic low level.

As described above, the dual-mode comparator 940 may have a structure capable of performing an auto-zero operation in the auto-zero mode, and may have a structure capable of maintaining a current (i.e., a bias current) consumed before and after the decision point of the dual-mode comparator 940 in the comparison mode. As a result, the analog to digital converter 900 having the dual-mode comparator 940 may prevent a power voltage fluctuation. Further, since a structure of the dual-mode comparator 940 is exemplary, a structure of the dual-mode comparator 940 may be changed according to required conditions.

Figure 12:
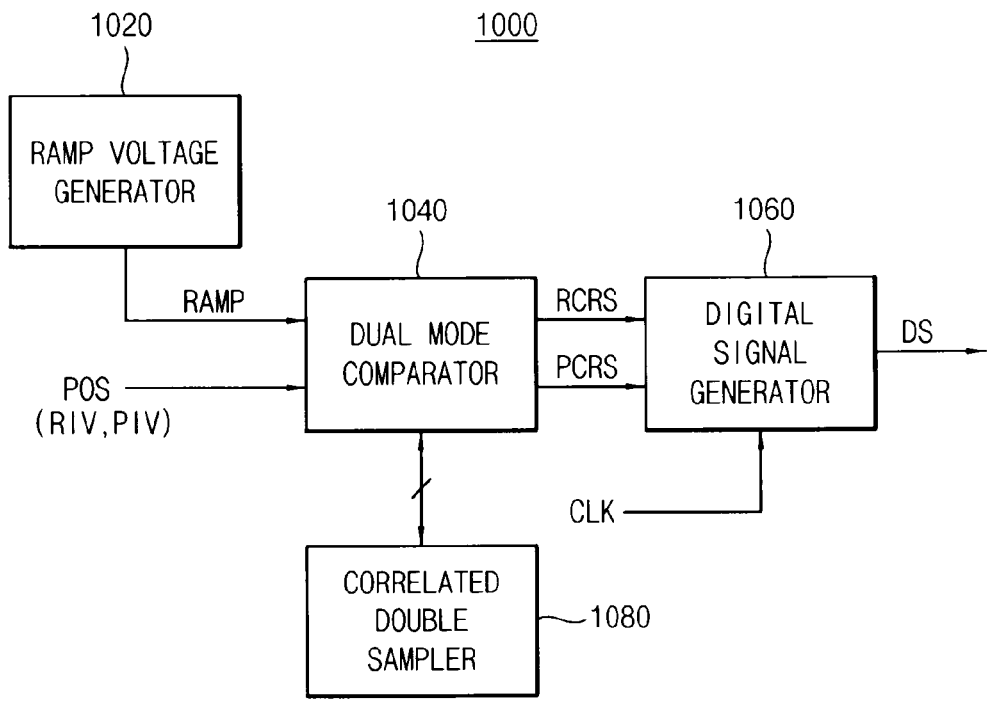
FIG. 12 is a block diagram illustrating an analog to digital converter according to an example embodiment.

FIG. 12 is a block diagram illustrating an analog to digital converter according to an example embodiment.

Referring to FIG. 12, the ramp voltage generator 1020, a dual-mode comparator 1040, a digital signal generator 1060, and a correlated double sampler 1080.

The ramp voltage generator 1020 may generate a ramp voltage RAMP that is increased or decreased at a predetermined slope. The dual-mode comparator 1040 may have a structure that is changed according to operation modes (i.e., an auto-zero mode and a comparison mode), may perform an offset eliminating operation in the auto-zero mode, and may generate a first comparison result signal RCRS and a second comparison result signal PCRS by comparing a pixel output voltage POS with the ramp voltage RAMP in the comparison mode.

The pixel output voltage POS may correspond to a reset voltage RIV or a conversion voltage PIV because the analog to digital converter 1000 may perform a correlated double sampling operation using the correlated double sampler 1080. Here, the reset voltage RIV indicates the pixel output voltage POS generated by specific noises of a unit pixel, and the conversion voltage PIV indicates the pixel output voltage PV generated by photoelectric transformations.

The first comparison result signal RCRS may correspond to a comparison result signal generated by comparing the ramp voltage RAMP with the reset voltage RIV. The second comparison result signal PCRS may correspond to a comparison result signal generated by comparing the ramp voltage RAMP with the conversion voltage PIV.

In one example embodiment, the dual-mode comparator 1040 may include an object voltage input unit that generates a first current flowing through a first path and a second current flowing through a second path based on a first object voltage and a second object voltage, a current mirror unit that performs a current-mirror operation for the first path and the second path and outputs a comparison voltage at an output terminal, a bias unit that generates a bias current corresponding to a sum of the first current and the second current, and a mode switching unit that controls the current mirror unit to have a first structure in the auto-zero mode and to have a second structure in the comparison mode. Since the dual-mode comparator 1040 is described above, duplicated descriptions will be omitted below.

The digital signal generator 1060 may generate a digital signal DS corresponding to the pixel output voltage POS based on the first and second comparison result signals RCRS and PCRS, respectively, using a clock signal counting method. For example, the digital signal generator 1060 may generate the digital signal DS corresponding to the pixel output voltage POS by counting a clock signal CLK until the ramp voltage RAMP is the same as the pixel output voltage POS.

In one example embodiment, the digital signal generator 1060 may include a counter unit that counts the clock signal CLK based on the first comparison result signal RCRS or the second comparison result signal PCRS, and a bit processing unit that processes a bit generated by the counter unit. Although it is illustrated that the clock signal CLK is input to the digital signal generator 1060, any circuit for generating the clock signal CLK may be included in the digital signal generator 1060.

As described above, the correlated double sampler 1080 may perform a correlated double sampling operation for the pixel output voltage POS. Namely, the correlated double sampler 1080 may control the analog to digital converter 1000 to generate a first digital signal by performing an analog to digital converting (ADC) operation for the reset voltage RIV, to generate a second digital signal by performing an ADC operation for the conversion voltage PIV, and to output the digital signal DS by subtracting the second digital signal from the first digital signal. Generally, both of the reset voltage RIV and the conversion voltage PIV output from a unit pixel include the same offset voltage due to errors caused when an active pixel array is fabricated and/or the ADC operation is performed. Hence, the correlated double sampler 1080 may perform the correlated double sampling operation to eliminate (or reduce) the offset voltage by subtracting the conversion voltage PIV from the reset voltage RIV.

According to some example embodiments, the analog to digital converter 1000 may reduce a time for generating the digital signal DS corresponding to the pixel output voltage POS by dividing a comparison operation into a coarse comparison operation and a fine comparison operation when the pixel output voltage POS is compared with the ramp voltage RAMP. In this case, the digital signal DS may be divided into the most significant bits (MSBs) and the least significant bits (LSBs). That is, the analog to digital converter 1000 may calculate the most significant bits in the coarse comparison mode, may calculate the least significant bits in the fine comparison mode, and may generate the digital signal DS by summing the most significant bits and the least significant bits. For example, it is assumed that the pixel output voltage POS is converted into the digital signal DS of 8 bits, the most significant bits of 4 bits may be calculated in the coarse comparison mode, and the least significant bits of 4 bits may be calculated in the fine comparison mode. Then, the analog to digital converter 1000 may output the digital signal DS by summing the most significant bits and the least significant bits. As a result, a digital signal processor may display an image corresponding to the digital signal DS on a display panel.

As described above, the analog to digital converter 1000 may prevent a power voltage fluctuation because the analog to digital converter 1000 includes the dual-mode comparator 1040 capable of maintaining a current (i.e., a bias current) consumed before and after the decision point of the dual-mode comparator 1040 when the pixel output voltage POS is compared with the ramp voltage RAMP. Thus, an image sensor having the analog to digital converter 1000 may output an image having a high quality. Further, the analog to digital converter 1000 may be applied to a high-resolution image sensor because the dual-mode comparator 1040 has a simple structure. Although it is described above that the analog to digital converter 1000 is implemented by a column analog to digital converting manner, it is not limited thereto.

Figure 13:
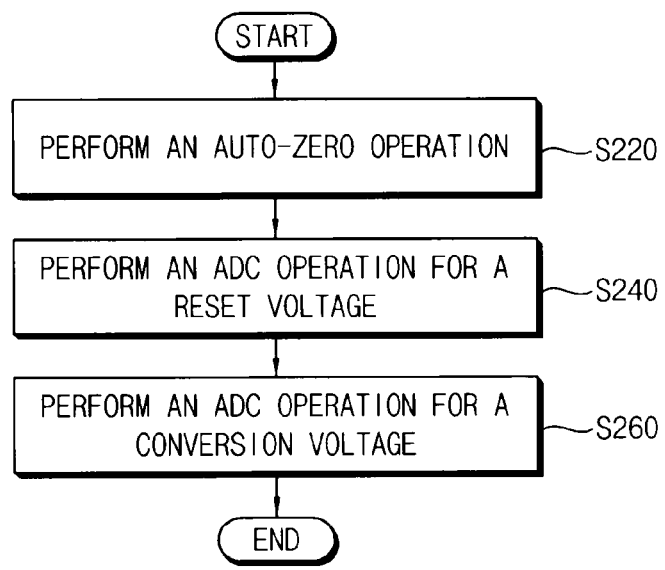
FIG. 13 is a flow chart illustrating operations of an analog to digital converter of FIG. 12.

FIG. 13 is a flow chart illustrating operations of an analog to digital converter of FIG. 12.

Referring to FIGS. 12 and 13, after the analog to digital converter 1000 performs an auto-zero operation (Step S220), the analog to digital converter 1000 performs an analog to digital conversion ADC operation for a reset voltage RIV (Step S240), and performs an ADC operation for a conversion voltage PIV (Step S260). As described above, the analog to digital converter 1000 may perform a correlated double sampling operation. Thus, the analog to digital converter 1000 may include a correlated double sampler 1080 that performs the correlated double sampling operation.

The analog to digital converter 1000 may generate a first digital signal by performing an ADC operation for the reset voltage RIV, may generate a second digital signal by performing an ADC operation for the conversion voltage PIV, and may output the digital signal DS by subtracting the second digital signal from the first digital signal. As a result, the analog to digital converter 1000 may eliminate (or reduce) an offset voltage, the offset voltage being caused when an active pixel array is fabricated and/or the ADC operation is performed.

Figure 14:
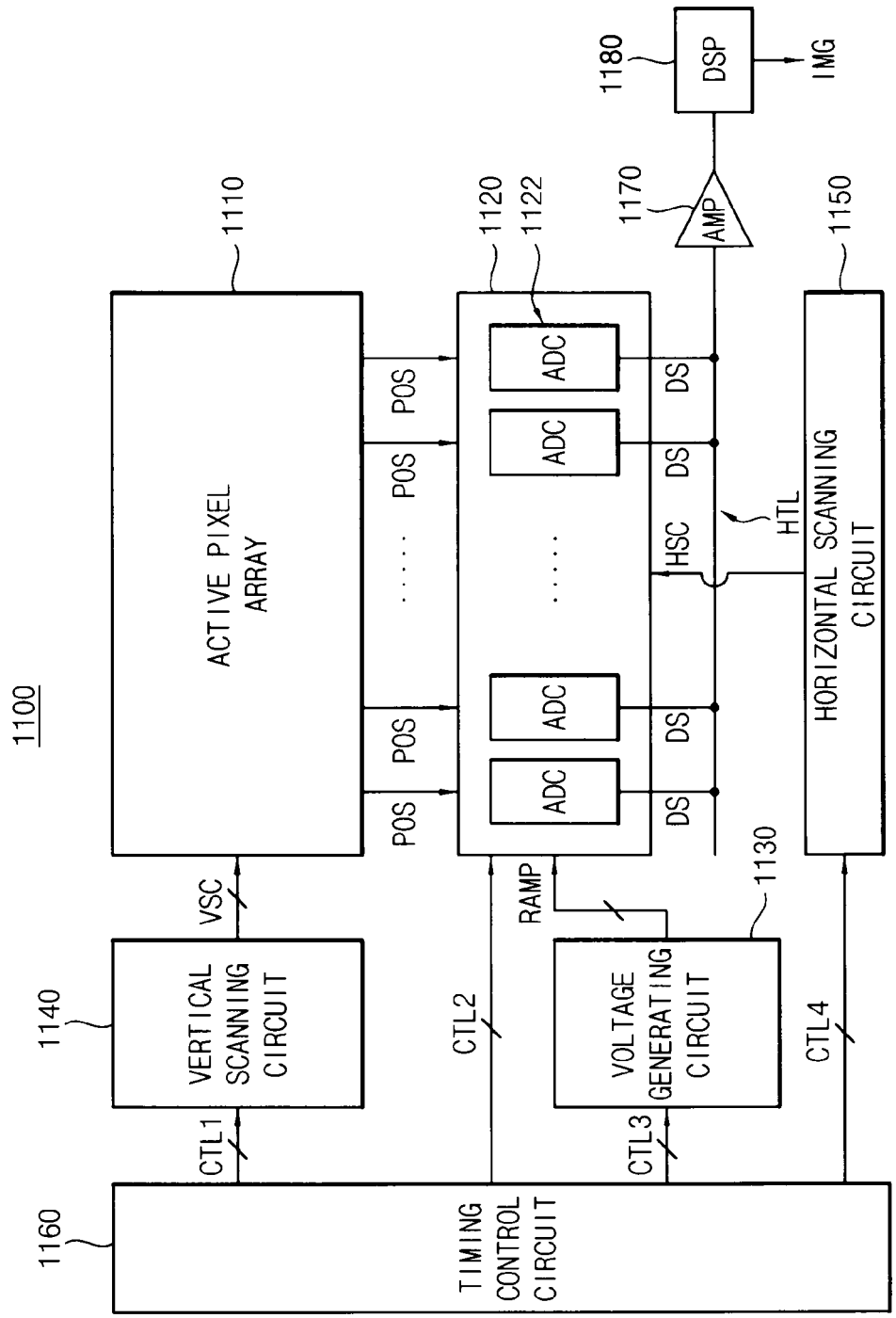
FIG. 14 is a block diagram illustrating an image sensor having an analog to digital converter according to an example embodiment.

FIG. 14 is a block diagram illustrating an image sensor having an analog to digital converter according to an example embodiment.

Referring to FIG. 14, the image sensor 1100 may include an active pixel array 1110, an analog to digital converting circuit 1120, a voltage generating circuit 1130, a vertical scanning circuit 1140, a horizontal scanning circuit 1150, a timing control circuit 1160, an amplifying circuit 1170, and a digital signal processing circuit 1180.

In the image sensor 1100, the number of analog to digital converters 1122 in the analog to digital converting circuit 1120 may be the same as the number of column-lines coupled to the active pixel array 1110, and the column-lines may be coupled to the analog to digital converters 1122, respectively. That is, the image sensor 1100 may be implemented by a column analog to digital conversion manner.

The active pixel array 1110 may include a plurality of unit pixels arranged in matrix manner. Each of the unit pixels may include a photodiode and a signal generating circuit. Each of the unit pixels may have 3-transistor structure, 4-transistor structure, 5-transistor structure, etc according to the number of transistors in the signal generating circuit. Row-lines and column-lines may be arranged in a cross manner on the active pixel array 1110. For example, when the active pixel array 1110 includes m*n unit pixels, n row-lines and m column-lines may be arranged in a cross manner on the active pixel array 1110.

In one example embodiment, the image sensor 1100 may employ a Bayer pattern technique. In this case, the unit pixels in the active pixel array 1110 may be arranged to receive a set of red light, green light, and blue light, or a set of magenta light, yellow light, and cyan light. In one example embodiment, the image sensor 1100 may employ an auto dark level compensation (ALDC) technique. In this case, at least one optical black pixel array may be arranged near the active pixel array 1110.

The analog to digital converting circuit 1120 may convert pixel output voltages POS output from the unit pixels in the active pixel array 1110 into digital signals DS. The analog to digital converting circuit 1120 may include at least one analog to digital converter 1122 that generates the digital signal DS.

In one example embodiment, the analog to digital converter 1122 may include a ramp voltage generator that generates a ramp voltage RAMP, a dual-mode comparator that performs an offset eliminating operation in an auto-zero mode and generates a comparison result signal by comparing a pixel output voltage POS with the ramp voltage RAMP in a comparison mode, a structure of the dual-mode comparator being changed according to operation modes (i.e., the auto-zero mode and the comparison mode), and a digital signal generator that generates the digital signal DS corresponding to the pixel output voltage POS based on the comparison result signal by a clock signal counting method.

According to some example embodiments, the analog to digital converter 1122 may further include a correlated double sampler that performs a correlated double sampling operation for the pixel output voltage POS. Here, the dual-mode comparator may include an object voltage input unit that generates a first current flowing through a first path and a second current flowing through a second path based on the pixel output voltage POS and the ramp voltage RAMP, a current mirror unit that performs a current-mirror operation for the first path and the second path and outputs a comparison voltage at an output terminal, a bias unit that generates a bias current corresponding to a sum of the first current and the second current, and a mode switching unit that controls the current mirror to have a first structure in the auto-zero mode and to have a second structure in the comparison mode.

The dual-mode comparator may have a structure capable of performing an auto-zero operation in the auto-zero mode, and may have a structure capable of maintaining a current (i.e., a bias current) consumed before and after the decision point of the dual-mode comparator in the comparison mode. Since the dual-mode comparator is described above, duplicated descriptions will be omitted below. Meanwhile, the analog to digital converting circuit 1120 may perform an ADC operation based on control signals CTL2 input from the timing control circuit 1160. The ADC operation may be performed during every horizontal scan period.

The voltage generating circuit 1130 may generate a plurality of voltages (e.g., the ramp voltage, etc) to provide the voltages to the at least one analog to digital converter 1122 in the analog to digital converting circuit 1120.

The vertical scanning circuit 1140 may receive control signals CTL1 from the timing control circuit 1160, and may control row address and row scanning operation for the active pixel array 1110. That is, the vertical scanning circuit 1140 may provide a signal for activating one of row-lines to select the one of row-lines. In one example embodiment, the vertical scanning circuit 1140 may include a vertical decoder and a vertical driver. The vertical decoder may select one of row-lines. The vertical driver may provide the signal for activating the selected row-line.

The horizontal scanning circuit 1150 may receive control signals CTL4 from the timing control circuit 1160, and may control column address and column scanning operation for the active pixel array 1110. That is, the horizontal scanning circuit 1150 may output the digital signals DS input from the analog to digital converting circuit 1120 to the digital signal processing circuit 1180 via the horizontal transfer-line HTL and the amplifying circuit 1170. For example, the horizontal scanning circuit 1150 may sequentially select the at least one analog to digital converter 1122 by outputting a horizontal scanning control signal HSC to the analog to digital converting circuit 1120.

In one example embodiment, the horizontal scanning circuit 1150 may include a horizontal decoder and a horizontal driver. The horizontal decoder may select the at least one analog to digital converter 1122 in the analog to digital converting circuit 1120. The horizontal driver may drive an output of the selected analog to digital converter 1122 to the horizontal transfer-line HTL.

The timing control circuit 1160 may control the vertical scanning circuit 1140, the analog to digital converting circuit 1120, the voltage generating circuit 1130, and the horizontal scanning circuit 1150, etc based on a master clock signal (not illustrated). That is, the timing control circuit 1160 may provide control signals CTL1, CTL2, CTL3, and CTL4 (e.g., a clock signal, a timing control signal, etc) for operating the vertical scanning circuit 1140, the analog to digital converting circuit 1120, the voltage generating circuit 1130, and the horizontal scanning circuit 1150, etc. In one example embodiment, the timing control circuit 1160 may include a logic control circuit, a phase lock loop (PLL) circuit, a communication interface circuit, etc.

The amplifying circuit 1170 may amplify the digital signals DS to output the amplified digital signals DS to the digital signal processing circuit 1180. Although one amplifying circuit 1170 is illustrated in FIG. 14, the image sensor 1100 may include a plurality of amplifying circuits 1170.

The digital signal processing circuit 1180 may receive the amplified digital signals DS from the amplifying circuit 1170, and may generate an image signal IMG based on the amplified digital signals DS. Then, the image signal IMG output from the digital signal processing circuit 1180 may be displayed on a display panel of a display device such as a liquid crystal display (LCD) device, a organic light emitting display device (OLED).

Figure 15:
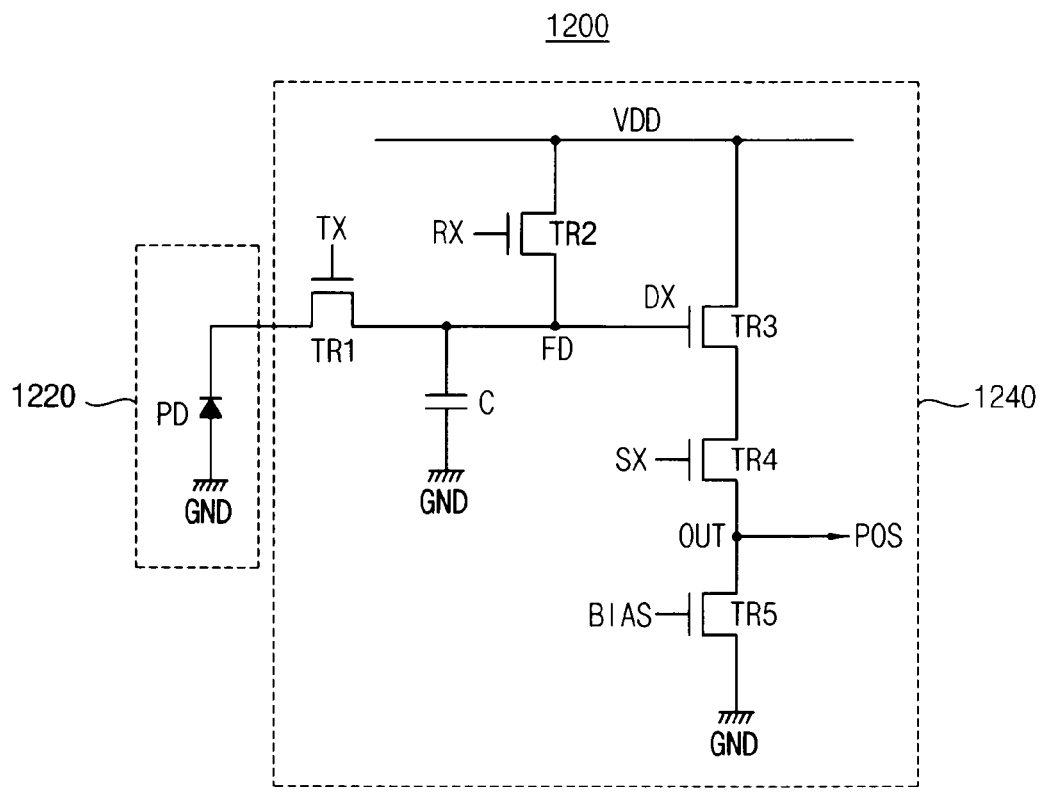
FIG. 15 is a diagram illustrating an example of a unit pixel arranged in an active pixel array of an image sensor of FIG. 14.

FIG. 15 is a diagram illustrating an example of a unit pixel arranged in an active pixel array of an image sensor of FIG. 14.

Referring to FIG. 15, the unit pixel 1200 may include a photodiode 1220 and a signal generating circuit 1240. The unit pixel 1200 may have 3-transistor structure, 4-transistor structure, 5-transistor structure, etc according to the number of transistors in the signal generating circuit 1240. As illustrated in FIG. 15, the unit pixel 1200 has a 5-transistor structure. Thus, the unit pixel 1200 may include the photodiode PD, a transfer transistor TR1, a reset transistor TR2, a source follower transistor TR3, a select transistor TR4, and a bias transistor TR5.

The photodiode 1220 may receive light from outside, and may perform photoelectric transformations to generate electric charges corresponding to the light. Then, the signal generating circuit 1240 may output the pixel output voltage POS based on the electric charges generated by the photodiode 1220. The pixel output voltage POS as an analog signal may be converted into the digital signal DS by the at least one analog to digital converter 1222.

As described above, when the image sensor 1100 employs a Bayer pattern technique, the unit pixel 1200 may generate the pixel output voltage POS (i.e., the analog signal) corresponding to red light, green light, or blue light. In this case, a color filter (i.e., a red filter, a green filter, or a blue filter) may be placed on the unit pixel 1200. Alternatively, the unit pixel 1200 may generate the pixel output voltage POS (i.e., the analog signal) corresponding to magenta light, yellow light, or cyan light. In this case, a color filter (i.e., a magenta filter, a yellow filter, or a cyan filter) may be placed on the unit pixel 1200.

The photodiode PD may be placed between the transfer transistor TR1 and a ground voltage GND. The signal generating circuit 1240 may include the transfer transistor TR1, the reset transistor TR2, the source follower transistor TR3, the select transistor TR4, and the bias transistor TR5. In addition, a floating diffusion node FD may be formed by a capacitor C.

In the transfer transistor TR1, a gate terminal of the transfer transistor TR1 may receive a transfer signal TX, a first terminal of the transfer transistor TR1 may be coupled to the photodiode PD, and a second terminal of the transfer transistor TR1 may be coupled to the floating diffusion node FD. Thus, the transfer transistor TR1 may transfer the electric charges generated by the photodiode PD to the floating diffusion node FD.

In the reset transistor TR2, a gate terminal of the reset transistor TR2 may receive a reset signal RX, a first terminal of the reset transistor TR2 may be coupled to the floating diffusion node FD, and a second terminal of the reset transistor TR2 may be coupled to a power voltage VDD.

In the source follower transistor TR3, a gate terminal of the source follower transistor TR3 may be coupled to the floating diffusion node FD, a first terminal of the source follower transistor TR3 may be coupled to a second terminal of the select transistor TR4, and a second terminal of the source follower transistor TR3 may be coupled to the power voltage VDD.

In the select transistor TR4, a gate terminal of the select transistor TR4 may receive a row selection signal SX, a first terminal of the select transistor TR4 may be coupled to an output terminal OUT, and the second terminal of the select transistor TR4 may be coupled to the first terminal of the source follower transistor TR3.

In the bias transistor TR5, a gate terminal of the bias transistor TR5 may receive a bias voltage BIAS, a first terminal of the bias transistor TR5 may be coupled to the output terminal OUT, and a second terminal of the bias transistor TR5 may be coupled to the ground voltage GND.

According to operations of the unit pixel 1200, the photodiode PD may transform the light to the electric charges. The transfer transistor TR1 may turn-on when the transfer signal TX is input to the gate terminal of the transfer transistor TR1. Thus, the electric charges generated by the photodiode PD may be transferred to the floating diffusion node FD when the transfer signal TX is input to the gate terminal of the transfer transistor TR1. Here, the reset transistor TR2 is maintained in a turn-off state so that electric potential of the floating diffusion node FD may be changed by the electric charges. As the electric potential of the floating diffusion node FD is changed, the electric potential of the gate terminal of the source follower transistor TR3 may be changed. Then, a bias of the first terminal of the source follower transistor TR3 (i.e., a bias of the second terminal of the select transistor TR4) may be changed. When the row selection signal SX is input to the gate terminal of the select transistor TR4, the pixel output voltage POS may be output through the output terminal OUT. Then, the reset transistor TR2 turns-on based on the reset signal RX so that a sensing process may be initialized. That is, the electric charges in the floating diffusion node FD may be discharged to a power source (i.e. the power voltage VDD). As a result, the electric potential of the floating diffusion node FD may be substantially the same as the power voltage VDD.

As described above, the at least one analog to digital converter 1122 may further include a correlated double sampler that performs a correlated double sampling operation for the pixel output voltage POS. The unit pixel 1200 may output the pixel output voltage POS (i.e., the reset voltage RIV and the conversion voltage PIV) for the correlated double sampling operation.

The at least one analog to digital converter 1122 may turn-on the transfer transistor TR1 and the reset transistor TR2, and may turn-off the select transistor TR4. Thus, the light sensing operation may be ready because the photodiode PD is fully depleted. Then, the at least one analog to digital converter 1122 may perform the photoelectric transformations by turning-off the transfer transistor TR1. At this time, if the at least one analog to digital converter 1122 turns-off the reset transistor TR2 and the select transistor TR4, the reset voltage RIV may be output as the pixel output voltage POS because the power voltage VDD is applied to the floating diffusion node FD. Subsequently, if the at least one analog to digital converter 1122 turns-on the transfer transistor TR1, the conversion voltage PIV may be output as the pixel output voltage POS because the electric charges generated by the photodiode PD are applied into the floating diffusion node FD. Thus, the at least one analog to digital converter 1122 may perform the correlated double sampling operation by performing the ADC operations for the reset voltage RIV and the conversion voltage PIV.

Figure 16:
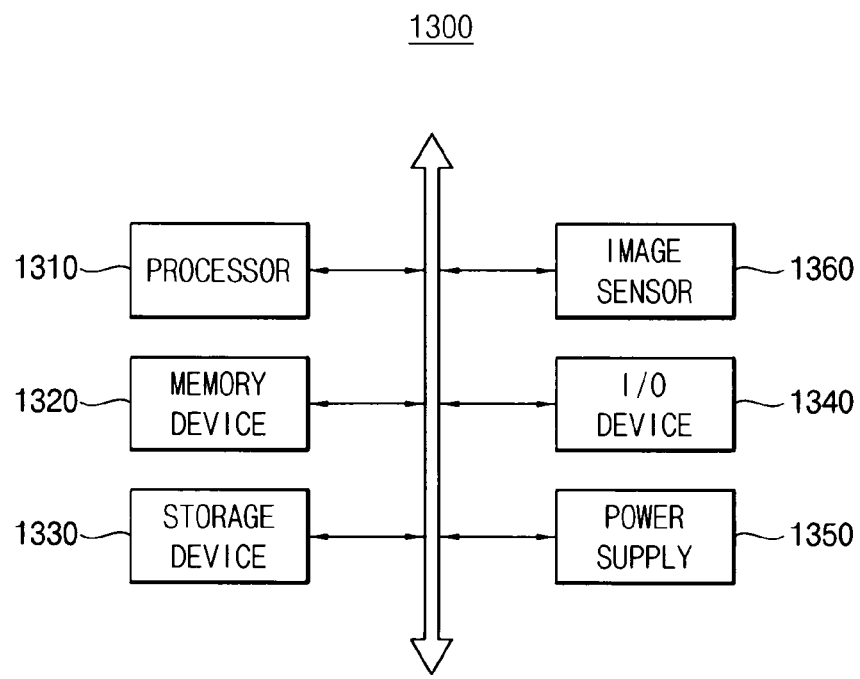
FIG. 16 is a block diagram illustrating an example of a computing system having an image sensor of FIG. 14.

FIG. 16 is a block diagram illustrating an example of a computing system having an image sensor of FIG. 14.

Referring to FIG. 16, the computing system 1300 may include a processor 1310, a memory device 1320, a storage device 1330, an input/output (I/O) device 1340, a power supply 1350, and an image sensor 1360. Here, the image sensor 1360 may correspond to the image sensor 1100 of FIG. 14. The computing system 1300 may be an electric device having at least one image sensor such as a computer, a laptop, a video phone, a monitoring system, an image stabilization system, etc. As not illustrated in FIG. 16, the computing system 1300 may further include a plurality of ports for communicating a video card, a sound card, a memory card, a universal serial bus (USB) device, other computing systems, etc.

The processor 1310 may perform various computing functions. The processor 1310 may be a micro processor, a central processing unit (CPU), etc. The processor 1310 may be coupled to the memory device 1320, the storage device 1330, and the I/O device 1340 via an address bus, a control bus, a data bus, etc. According to some example embodiments, the processor 1310 may be coupled to an extended bus such as a peripheral component interconnection (PCI) bus.

The memory device 1320 may store data for operations of the computing system 1300. For example, the memory device 1320 may include a volatile semiconductor memory device such as a dynamic random access memory (DRAM) device, a static random access memory (SRAM) device, a mobile DRAM, etc, and a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc.

The storage device 1330 may be a solid state drive device, a hard disk drive device, a CD-ROM device, etc. The I/O device 1340 may include an input device such as a keyboard, a keypad, a mouse, etc, and an output device such as a printer, a display device, etc. The power supply 1350 may provide a power for operations of the computing system 1300.

The image sensor 1360 may communicate with the processor 1310 via buses or other communication links. As described above, the image sensor 1360 may include a plurality of analog to digital converters 1122 in the analog to digital converting circuit 1120. Each of the analog to digital converters 1122 may include a dual-mode comparator that has a structure capable of performing an auto-zero operation in an auto-zero mode, and that has a structure capable of maintaining a current (i.e., a bias current) consumed before and after a decision point of the dual-mode comparator in a comparison mode. As a result, a power voltage fluctuation may be prevented within the analog to digital converting circuit 1120. Since the dual-mode comparator is described above, duplicated descriptions will be omitted below. According to some example embodiments, the image sensor 1360 may be integrated with the processor 1310 in one chip.

Figure 17:
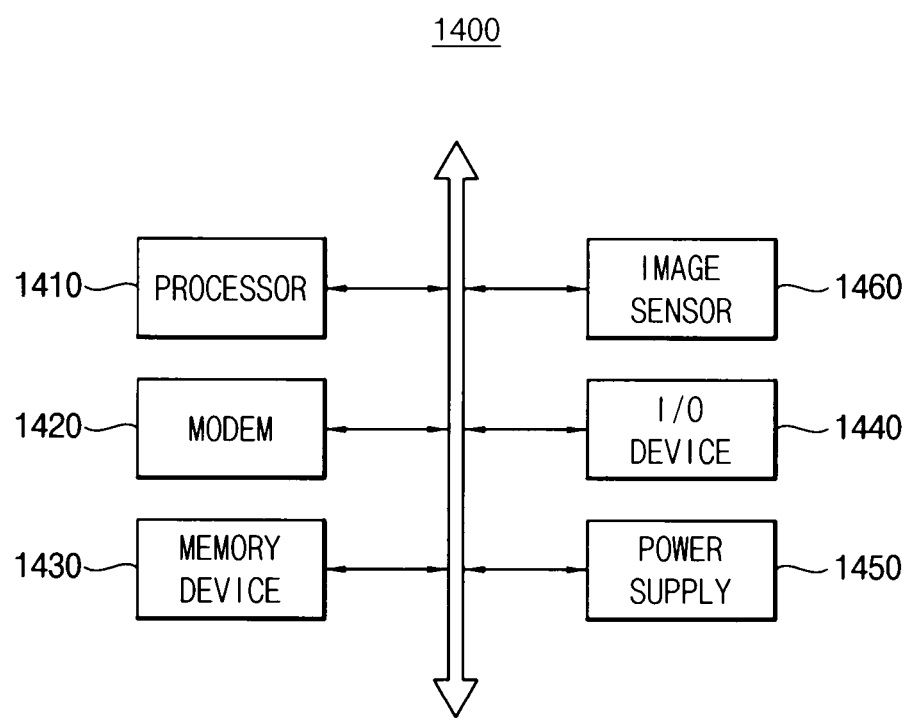
FIG. 17 is a block diagram illustrating an example of a mobile system having an image sensor of FIG. 14.

FIG. 17 is a block diagram illustrating an example of a mobile system having an image sensor of FIG. 14.

Referring to FIG. 17, the mobile system 1400 may include a processor 1410, a modem 1420, a memory device 1430, an I/O device 1440, a power supply 1450, and an image sensor 1460. Here, the image sensor 1460 may correspond to the image sensor 1100 of FIG. 14. The mobile system 1400 may be an electric device having at least one image sensor such as a digital camera, a cellular phone, a smart phone, a personal digital assistant (PDA), a portable multimedia player (PMP), a MP3 player, a mobile game console, a navigation system, etc.

The processor 1410 may perform various computing functions. For example, the processor 1410 may execute applications such as an internet browser application, a 3D-map application, etc. The processor 1410 may be a micro processor, a central processing unit (CPU), etc. The processor 1410 may be coupled to other components via an address bus, a control bus, a data bus, etc. The modem 1420 may receive external data from outside, and may transmit internal data to outside. For example, the modem 1420 may be a modem processor that supports a global system for mobile communication (GSM), a general packet radio service (GPRS), a wideband code division multiple access (WCDMA), etc. According to some example embodiments, the processor 1410 and the modem 1420 may be implemented in one chip.

The memory device 1430 may store data for operations of the mobile system 1400. The memory device 1430 may include at least one non-volatile semiconductor memory device and/or at least one volatile semiconductor memory device. In this case, the non-volatile semiconductor memory device may store a boot-code for booting the mobile system 1400. For example, the non-volatile semiconductor memory device may correspond to an EPROM device, an EEPROM device, a flash memory device, a PRAM device, a RRAM device, a NFGM device, a PoRAM device, a MRAM device, a FRAM device, etc. In addition, the volatile semiconductor memory device may store data received or transmitted by the modem 1420, and data processed by the processor 1410. For example, the volatile semiconductor memory device may correspond to a DRAM device, a SRAM device, a mobile DRAM device, etc. The I/O device 1440 may include an input device such as a keyboard, a keypad, a mouse, a touch screen, etc, and an output device such as a printer, a display, a speaker, etc. The power supply 1450 may provide a power for operations of the mobile system 1400.

The image sensor 1460 may communicate with the processor 1410 via buses or other communication links. As described above, the image sensor 1460 may include a plurality of analog to digital converters 1122 in the analog to digital converting circuit 1120. Each of the analog to digital converters 1122 may include a dual-mode comparator that has a structure capable of performing an auto-zero operation in an auto-zero mode, and that has a structure capable of maintaining a current (i.e., a bias current) consumed before and after a decision point of the dual-mode comparator in a comparison mode. As a result, a power voltage fluctuation may be prevented within the analog to digital converting circuit 1120. Since the dual-mode comparator is described above, duplicated descriptions will be omitted below.

According to some example embodiments, the image sensor 1460 may be integrated with the processor 1410 in one chip. The mobile system 1400 may be implemented by various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat-Pack (TQFP), Small Outline Integrated Circuit (SOIC), Shrink Small Outline Package (SSOP), Thin Small Outline Package (TSOP), Thin Quad Flat-Pack (TQFP), System In Package (SIP), Multi Chip Package (MCP), Wafer-level Fabricated Package (WFP), Wafer-Level Processed Stack Package (WSP).

Figure 18:
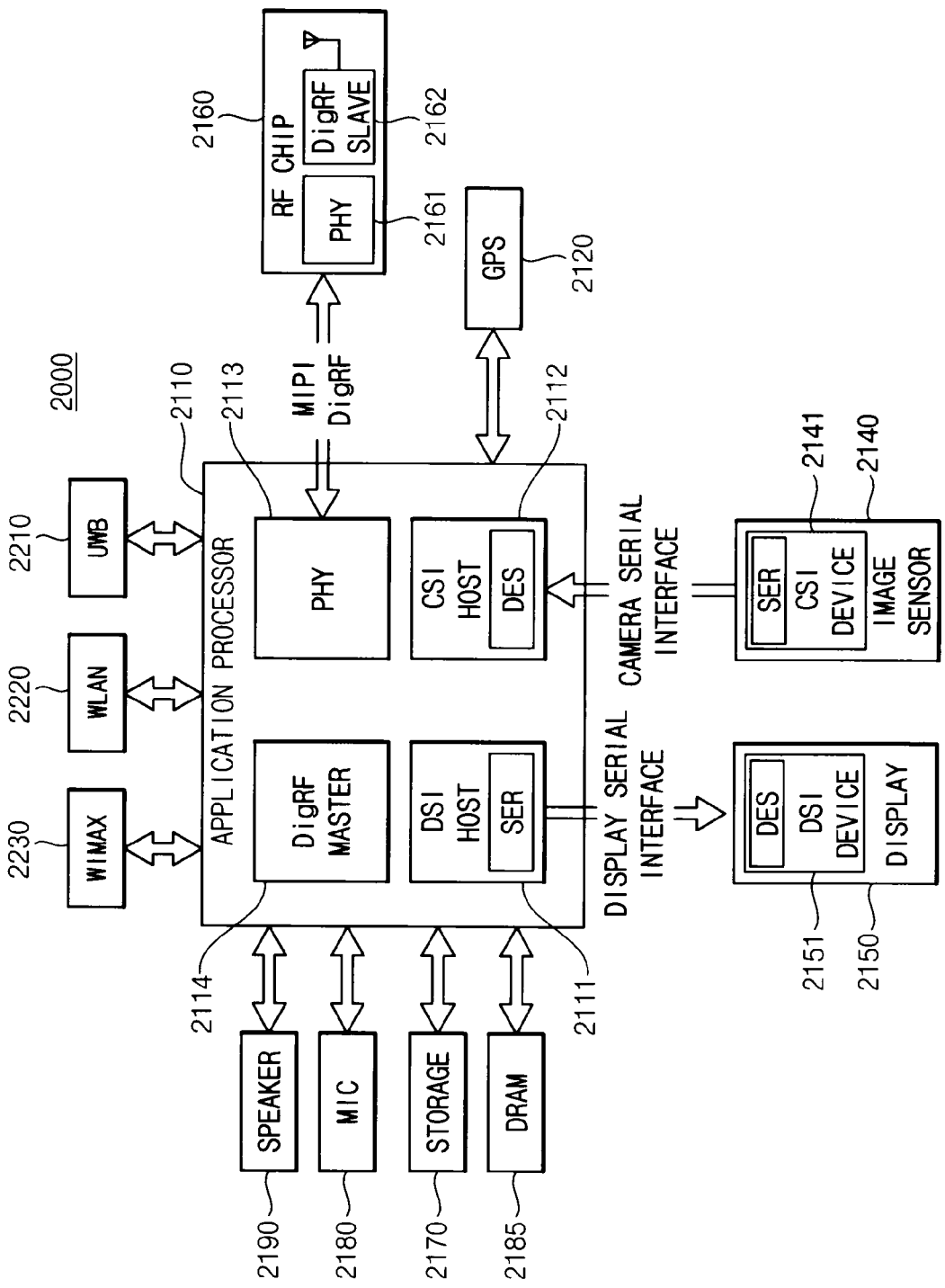
FIG. 18 is a block diagram illustrating an example of an interface used for a specific system having an image sensor of FIG. 14.

FIG. 18 is a block diagram illustrating an example of an interface used for a specific system having an image sensor of FIG. 14.

Referring to FIG. 18, the system 2000 may be implemented by a data processing device that uses, or supports a mobile industry processor interface (MIPI) interface (e.g., a mobile phone, a personal digital assistant (PDA), a portable multimedia player (PMP), a smart phone, etc). The system 2000 may include an application processor 2010, an image sensor 2140, a display device 2150 and other various input/output devices discussed in detail below.

A CSI host 2112 of the application processor 2110 may perform a serial communication with a CSI device 2141 of the image sensor 2140 using a camera serial interface (CSI). In one example embodiment, the CSI host 2112 may include a light deserializer (DES), and the CSI device 2141 may include a light serializer (SER). A DSI host 2111 of the application processor 2110 may perform a serial communication with a DSI device 2151 of the display device 2150 using a display serial interface (DSI). In one example embodiment, the DSI host 2111 may include a light serializer (SER), and the DSI device 2151 may include a light deserializer (DES).

The system 2000 may further include a radio frequency (RF) chip 2160. The RF chip 2160 may perform a communication with the application processor 2110. A physical layer (PHY) 2113 of the system 2000 and a physical layer (PHY) 2161 of the RF chip 2160 may perform data communications based on a MIPI DigRF. The application processor 2110 may further include a DigRF MASTER 2114 that controls the data communications of the PHY 2161.

The system 2000 may include a global positioning system (GPS) 2120, a storage 2170, a MIC 2180, a DRAM device 2185, and a speaker 2190.

The system 2000 may perform communications using an ultra wideband (UWB) 2210, a wireless local area network (WLAN) 2220, and/or using a worldwide interoperability for microwave access (WIMAX) 2130. However, the structure and the interface of the system 2000 are not limited thereto.

The present inventive concepts may be applied to a comparator and/or an analog to digital converter having the comparator. For example, the present inventive concepts may be applied to an electric device having at least one image sensor such as a computer, a laptop, a digital camera, a 3D camera, a video camcorder, a cellular phone, a smart phone, a personal digital assistant (PDA), a portable multimedia player (PMP), a navigation system, a monitoring system, an auto focusing system, a video phone, a digital television, etc. The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A dual-mode comparator comprising:
an object voltage input unit configured to generate a first current flowing through a first path and a second current flowing through a second path based on a first object voltage and a second object voltage;
a current mirror unit configured to perform a current-mirror operation for the first path and the second path to output a comparison voltage at an output terminal;
a bias unit configured to generate a bias current corresponding to a sum of the first current and the second current; and
a mode switching unit configured to control the current mirror unit to have a first structure in an auto-zero mode, and to control the current mirror unit to have a second structure in a comparison mode.

2. The comparator of claim 1, wherein the object voltage input unit includes:
a first transistor configured to allow the first current to flow through the first path based on the first object voltage; and
a second transistor configured to allow the second current to flow through the second path based on the second object voltage.

3. The comparator of claim 2, wherein the current mirror unit includes:
a third transistor coupled between a first supply voltage and the first transistor, the third transistor located on the first path; and
a fourth transistor coupled between the first supply voltage and the second transistor, the fourth transistor located on the second path.

4. The comparator of claim 3, wherein the bias unit includes:
a fifth transistor coupled between the first and second transistors and a second supply voltage.

5. The comparator of claim 4, wherein the mode switching unit includes:
a first switch configured to turn-on in the auto-zero mode to couple gate electrodes of the third and fourth transistors to a drain electrode of the third transistor, and configured to turn-off in the comparison mode; and
a second switch configured to turn-on in the comparison mode to couple the gate electrodes of the third and fourth transistors to a drain electrode of the fourth transistor, and configured to turn-off in the auto-zero mode.

6. The comparator of claim 5, wherein the mode switching unit further includes:
a third switch configured to turn-on in the auto-zero mode to couple a gate electrode of the second transistor to a drain electrode of the second transistor, and configured to turn-off in the comparison mode.

7. The comparator of claim 5, wherein the mode switching unit further includes:
a fourth switch configured to turn-on in the auto-zero mode to couple a gate electrode of the first transistor to a drain electrode of the first transistor, and configured to turn-off in the comparison mode.

8. The comparator of claim 5, wherein the first structure is a structure in which the gate electrodes of the third and fourth transistors are coupled to the drain electrode of the third transistor, and the second structure is a structure in which the gate electrodes of the third and fourth transistors are coupled to the drain electrode of the fourth transistor.

9. The comparator of claim 8, wherein the first and second transistors are N-type metal oxide semiconductor (NMOS) transistors, the third and fourth transistors are P-type metal oxide semiconductor (PMOS) transistors, and the fifth transistor is a NMOS transistor.

10. The comparator of claim 9, wherein the first supply voltage corresponds to a power source voltage, and the second supply voltage corresponds to a ground voltage.

11. The comparator of claim 8, wherein the first and second transistors are PMOS transistors, the third and fourth transistors are NMOS transistors, and the fifth transistor is a PMOS transistor.

12. The comparator of claim 11, wherein the first supply voltage corresponds to a ground voltage, and the second supply voltage corresponds to a power source voltage.

13. An analog to digital converter comprising:
a ramp voltage generator configured to generate a ramp voltage;
a dual-mode comparator configured to,
perform an offset eliminating operation in an auto-zero mode, and
generate a comparison result signal by comparing the ramp voltage with a pixel output voltage in a comparison mode, and change a structure of the dual-mode comparator according to the auto-zero mode and the comparison mode; and
a digital signal generator configured to generate a digital signal corresponding to the pixel output voltage based on the comparison result signal.

14. The converter of claim 13, wherein the dual-mode comparator includes:
a first comparator configured to compare the ramp voltage with the pixel output voltage to generate a first comparison voltage; and
a second comparator configured to compare the first comparison voltage with a reference voltage to generate a second comparison voltage.

15. The converter of claim 14, wherein the second comparator includes:
an object voltage input unit configured to generate a first current flowing through a first path and a second current flowing through a second path based on the first comparison voltage and the reference voltage;
a current mirror unit configured to perform a current-mirror operation for the first path and the second path to output the second comparison voltage at an output terminal;
a bias unit configured to generate a bias current corresponding to a sum of the first current and the second current; and
a mode switching unit configured to control the current mirror unit to have a first structure in the auto-zero mode, and to control the current mirror unit to have a second structure in the comparison mode.

16. A dual-mode comparator configured to compare a first object voltage with a second object voltage, the dual-mode comparator comprising:
an object voltage input circuit configured to generate a same bias current before and after transition of at least the first object voltage from a first logic level to a second logic level.

17. The comparator of claim 16, further comprising:
a current mirror circuit configured to switch between a first structure in a first mode and a second structure in a second mode; and
a mode switching unit configured to switch the current mirror circuit between the first and the second structures, and to output a result of the comparison.

18. The comparator of claim 16, wherein the first mode is an auto-zero mode during which an offset between the first object voltage and the second object voltage is eliminated.

19. The comparator of claim 18, wherein the second mode is a comparison mode during which a comparison operation is performed between the first object voltage and the second object voltage.

20. An analog to digital converter comprising:
a ramp voltage generator configured to generate a ramp voltage;
the dual-mode comparator of claim 16, wherein the first object voltage is the ramp voltage and second object voltage is a pixel output voltage; and
a digital signal generator configured to generate a digital signal corresponding to the pixel output voltage based on the bias current generated by the dual-mode comparator.

* * * * *